(12) United States Patent
Chang

(10) Patent No.: US 7,939,371 B1
(45) Date of Patent: May 10, 2011

(54) FLIP-FLOP SEMICONDUCTOR DEVICE PACKAGING USING AN INTERPOSER

(75) Inventor: Bo Soon Chang, Cupertino, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 539 days.

(21) Appl. No.: 11/731,088

(22) Filed: Mar. 30, 2007

(51) Int. Cl.
*H01L 21/44* (2006.01)

(52) U.S. Cl. ............... 438/108; 438/112; 438/123

(58) Field of Classification Search .............. 438/108, 438/111, 112, 121–127
See application file for complete search history.

(56) References Cited

U.S. PATENT DOCUMENTS

| 5,569,956 | A | * | 10/1996 | Chillara et al. | 257/668 |
| 5,648,682 | A | * | 7/1997 | Nakazawa et al. | 257/673 |
| 6,903,449 | B2 | | 6/2005 | Kim et al. | |
| 7,049,173 | B2 | | 5/2006 | Kim et al. | |
| 7,126,209 | B2 | * | 10/2006 | Minamio et al. | 257/666 |
| 7,459,778 | B2 | | 12/2008 | Kim et al. | |
| 7,635,910 | B2 | | 12/2009 | Sinaga et al. | |
| 2005/0009216 | A1 | * | 1/2005 | Hauser et al. | 438/14 |
| 2005/0218493 | A1 | * | 10/2005 | Yang | 257/678 |
| 2007/0181982 | A1 | * | 8/2007 | Bathan et al. | 257/666 |
| 2009/0079048 | A1 | | 3/2009 | Govindaiah et al. | |
| 2010/0067312 | A1 | | 3/2010 | Lee et al. | |

FOREIGN PATENT DOCUMENTS

WO    WO 2006077452 A1 *  7/2006

OTHER PUBLICATIONS

USPTO Non-Final Rejection for U.S. Appl. No. 11/731,056 dated Apr. 28, 2010; 6 pages.
USPTO Requirement for Restriction/Election for U.S. Appl. No. 11/731,056 dated Nov. 13, 2009; 8 pages.
USPTO Notice of Allowance for U.S. Appl. No. 11/731,218 dated Jun. 2, 2010; 6 pages.
USPTO Non-Final Rejection for U.S. Appl. No. 11/731,218 dated Nov. 23, 2009; 5 pages.
USPTO Requirement for Restriction/Election for U.S. Appl. No. 11/731,218 dated Jun. 25, 2009; 7 pages.
USPTO Final Rejection for U.S. Appl. No. 11/731,056 dated Oct. 13, 2010; 7 pages.

* cited by examiner

*Primary Examiner* — Kevin M Picardat

(57) ABSTRACT

A semiconductor device package, a method of fabricating a semiconductor device package and a method of testing an integrated circuit utilizing a semiconductor device package are disclosed. Embodiments create a flip-flop semiconductor device package by coupling multiple leadfingers to conductive pads of a semiconductor device using an interposer with electrically conductive traces. The semiconductor device may be positioned in a face-up orientation between the leadfingers such that a single surface of the interposer may couple to both the semiconductor device and the leadfingers. The flip-flop package offers improved signaling properties, durability, reliability, and package density at reduced cost given that the interposer is configurable, the traces offer more reliable and durable interconnections, the interposer enables use of a smaller semiconductor device with a higher density conductive pad arrangement to decrease package density, and the interposer is relatively inexpensive.

11 Claims, 18 Drawing Sheets

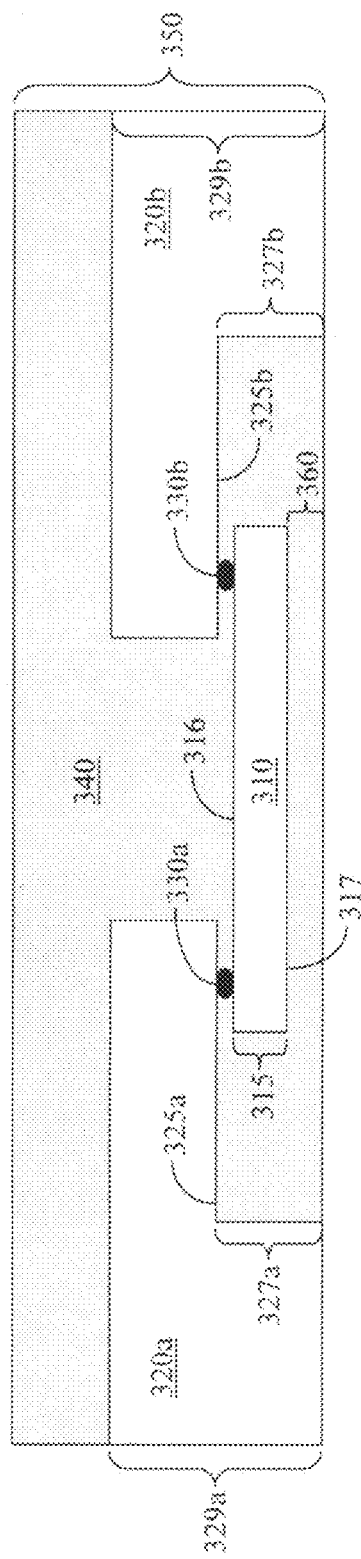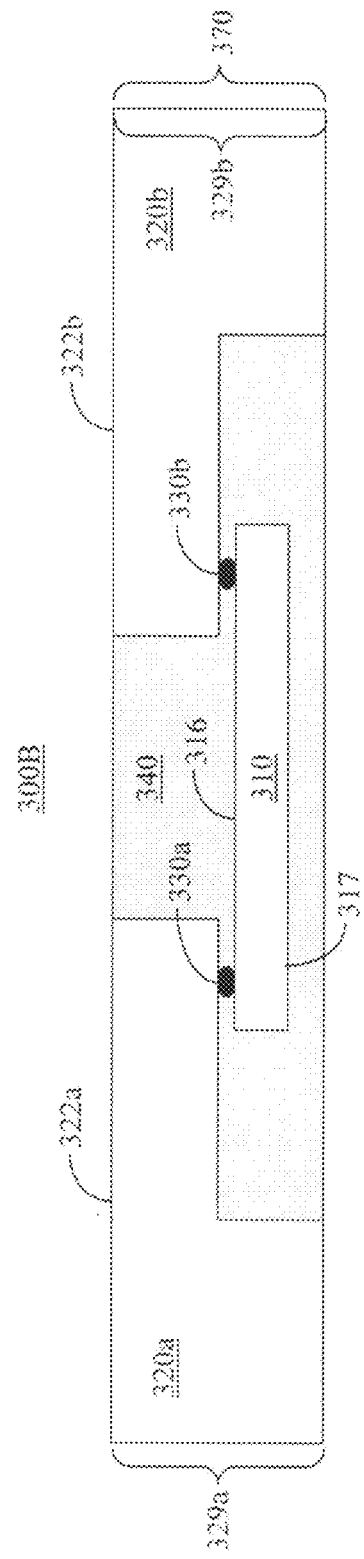
FIGURE 3A
FIGURE 3B

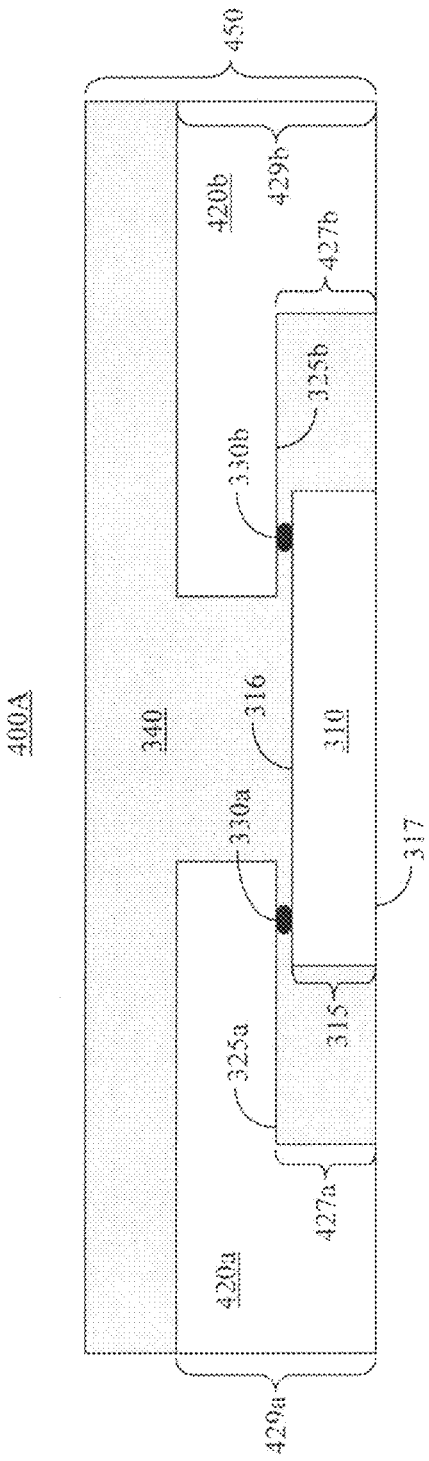
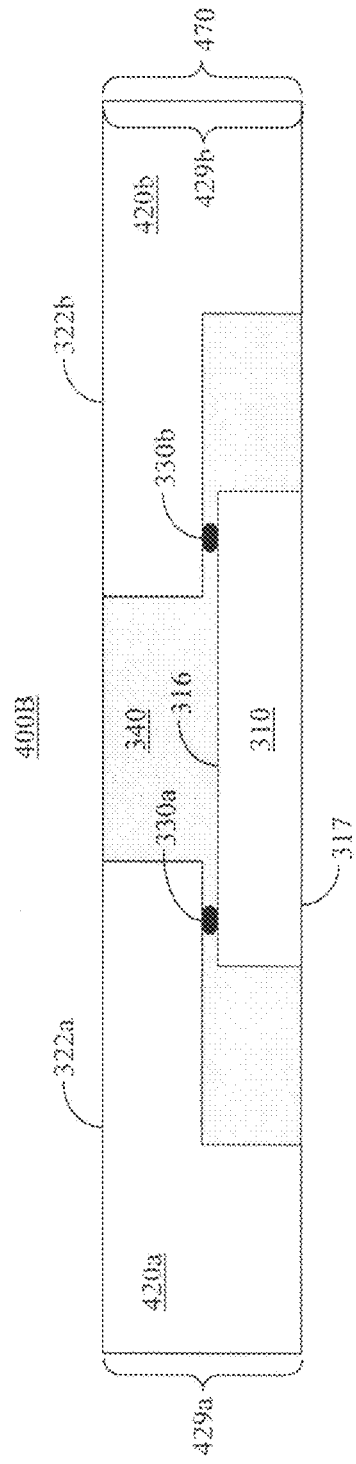
FIGURE 4A
FIGURE 4B

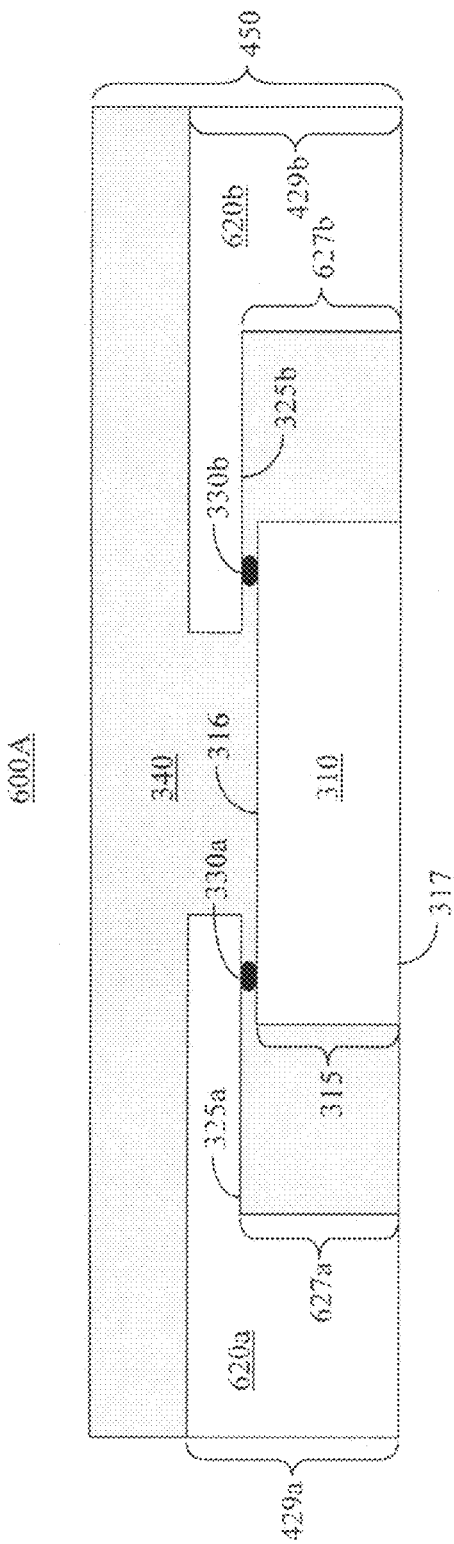
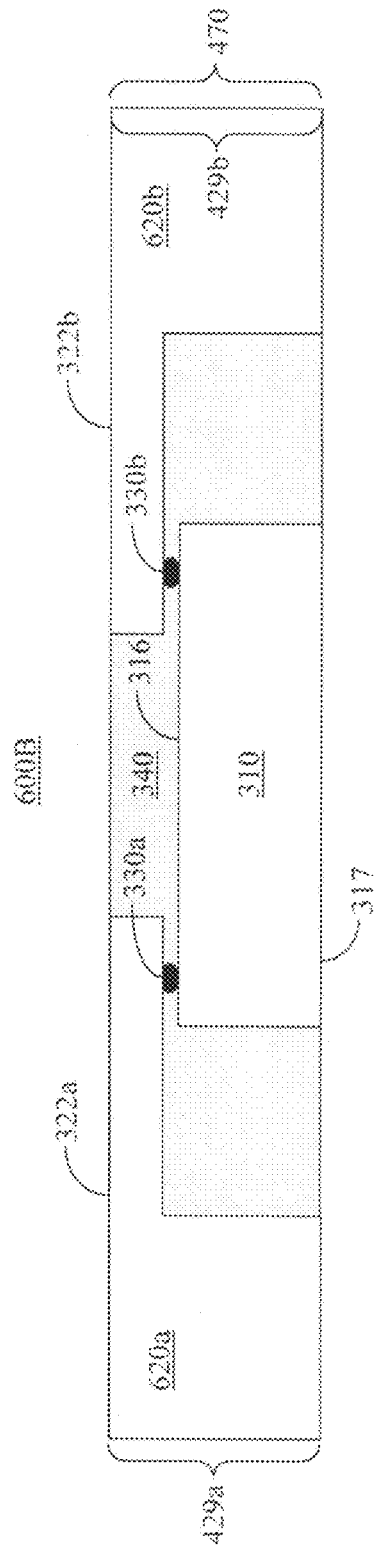
FIGURE 6A
FIGURE 6B

FLIP-FLOP SEMICONDUCTOR DEVICE PACKAGING USING AN INTERPOSER

RELATED APPLICATIONS

Patent The present application is related to U.S. patent application Ser. No. 11/731,218, filed Mar. 30, 2007, entitled "FLIP-FLOP SEMICONDUCTOR DEVICE PACKAGING USING ETCHED LEADFINGERS," naming Bo Chang as the inventor, assigned to the assignee of the present invention. That application is incorporated herein by reference in its entirety and for all purposes.

The present application is related to U.S. patent application Ser. No. 11/731,056, filed Mar. 30, 2007, entitled "FLIP-FLOP SEMICONDUCTOR DEVICE PACKAGING USING BENT LEADFINGERS," naming Carlo Gamboa as the inventor, assigned to the assignee of the present invention. That application is incorporated herein by reference in its entirety and for all purposes.

BACKGROUND OF THE INVENTION

As technology evolves, more and more applications demand integrated circuits with higher performance and smaller size. For example, many circuits utilize higher signaling speeds requiring integrated circuits with improved signal integrity for operation at such signaling speeds. Additionally, many applications now require increased durability and reliability. Further, applications often incorporate large number of integrated circuits, thereby demanding high packaging density to enable placement of a larger number of integrated circuits in a given circuit board area. Moreover, manufacturers and customers alike expect these requirements to be met with increased cost-savings.

Given these more demanding requirements, conventional integrated circuit packaging techniques are proving inadequate for an increasing number of modern applications. In particular, conventional wire-bonded and flip-chip configurations fail to provide adequate signal integrity, durability, reliability, package density and cost-savings.

As shown in FIGS. 1A and 1B, conventional wire-bonded semiconductor device package 100 comprises semiconductor device 110 with conductive pads 120. Wires 130 connect the conductive pads of device 100 to leadfingers 140, thereby providing electrical continuity between conductive pads 120 and leadfingers 140. Additionally, device 110, conductive pads 120, wires 130 and leadfingers 140 are encapsulated in packaging material 150.

Although wire-bonded semiconductor device packages (e.g., 100) were widely used for some time, their use in modern applications is more limited. Wire bonding provides poor signal integrity given long signal paths providing higher inductance, increased crosstalk, and more limited slew rates. Reflections produced by impedance mismatches of the wire bonding further reduce signal integrity. Additionally, wire-bonded semi conductor device packages (e.g., 100) have low packaging density due to the length of the wires (e.g., 130) connecting the conductive pads (e.g., 120) of the semiconductor device (e.g., 110) to the leadfingers (e.g., 140). Further, the durability and reliability associated with wire bonding is insufficient for modern applications. As such, in an attempt to improve on these limitations, flip-chip configurations were designed and implemented.

As shown in FIGS. 2A and 2B, conventional flip-chip semiconductor device package 200 comprises semiconductor device 210 with conductive pads 220 in a wire-bonded pad arrangement. Leadfingers 240 are bonded to conductive pads 220, thereby providing electrical continuity between conductive pads 220 and leadfingers 240. Additionally, device 210, conductive pads 220, and leadfingers 240 are encapsulated in packaging material 250.

Given that device 110 is positioned in a face-up orientation and device 210 is positioned in a face-down orientation, the pin assignments of each package are mirrored. For example, first pad 160 as shown in FIG. 1A is matched to first pin 170, whereas first pad 260 as shown in FIG. 2A is matched to pin 280 instead of first pin 270. As such, flip-chip configurations must either use devices with flip-chip pad arrangements (e.g., mirrored with respect to wire-bonded pad arrangements) or reroute signal paths to correctly connect pads of a device (e.g., 210) with a wire-bonded pad arrangement to leadfingers associated with appropriate pins. Creation of a device with a flip-chip pad arrangement adds significant cost given the design and manufacture of a new device. Rerouting signal paths of a reoriented device with a wire-bonded pad arrangement also adds cost, while introducing the same signal integrity, reliability and durability problems present in traditional wire-bonded device packages (e.g., 100). Further, rerouting signal paths often leads to longer and unequal-length signal paths, thereby exacerbating the signal integrity problems.

SUMMARY OF THE INVENTION

Accordingly, a need exists for semiconductor device packages with increased signal integrity. A need also exists for semiconductor device packages with increased durability and reliability. Additionally, a need exists for semiconductor device packages with higher packaging density and reduced cost. Embodiments of the present invention provide novel solutions to these needs and others as described below.

Embodiments of the present invention are directed to a semiconductor device package, a method of fabricating a semiconductor device package and a method of testing an integrated circuit utilizing a semiconductor device package. More specifically, embodiments create a flip-flop semiconductor device package by coupling multiple leadfingers to conductive pads of a semiconductor device using an interposer with electrically conductive traces. The semiconductor device may be positioned in a face-up orientation between the leadfingers such that a single surface of the interposer may couple to both the semiconductor device and the leadfingers. The flip-flop package offers improved signaling properties, durability, reliability, and package density at reduced cost given that the interposer is configurable (e.g., to alter trace properties to adjust or tune signaling properties), the traces offer more reliable and durable interconnections, the interposer enables use of a smaller semiconductor device with a higher density conductive pad arrangement (e.g., due to finer bump pitch, conductive pads disposed on a central region of the semiconductor device, etc.) to decrease package density, and the interposer is relatively inexpensive. Additionally, the flip-flop configuration provides convenient means for exposing surfaces of the device (e.g., to increase heat transfer therefrom, thermal performance of the device, etc.) and/or surfaces of the interposer (e.g., to provide test points, wire bondouts, etc.).

In one embodiment, a semiconductor device package includes a semiconductor device including a plurality of conductive pads. The semiconductor device package also includes a plurality of leadfingers, wherein each leadfinger comprises a conductive surface for electrical coupling. An interposer is included for electrically coupling the conductive surfaces of the plurality of leadfingers to the plurality of conductive pads of the semiconductor device, wherein the semiconductor device and the plurality of leadfingers are disposed in a flip-flop configuration. The semiconductor device package also includes a packaging material at least partially encapsulating the semiconductor device, the plurality of leadfingers, and the interposer, wherein the plurality of leadfingers extend from the packaging material to form pins.

In another embodiment, a method of fabricating a semiconductor device package includes coupling conductive surfaces of a plurality of leadfingers of a leadframe to a plurality of conductive pads of a semiconductor device using an interposer, wherein the semiconductor device and the plurality of leadfingers are disposed in a flip-flop configuration. The method also includes at least partially encapsulating the semiconductor device, the plurality of leadfingers, and the interposer in a packaging material to produce the semiconductor device package, wherein the plurality of leadfingers extend from the packaging material to form pins. The semiconductor device package is then detached from the leadframe. The method may further include manufacturing the interposer, wherein the interposer may be a printed circuit board with a plurality of traces for electrically coupling the conductive surfaces of the plurality of leadfingers to the plurality of conductive pads of the semiconductor device. Additionally, the method may include forming the pins of the semiconductor device package.

In yet another embodiment, a method of testing an integrated circuit includes selecting the integrated circuit for the testing, where the integrated circuit includes a semiconductor device including a plurality of conductive pads. The integrated circuit may also include a plurality of leadfingers, wherein each leadfinger includes a conductive surface for electrical coupling. An interposer may be included for electrically coupling the conductive surfaces of the plurality of leadfingers to the plurality of conductive pads of the semiconductor device, wherein the semiconductor device and the plurality of leadfingers are disposed in a flip-flop configuration. The integrated circuit may further include a packaging material at least partially encapsulating the semiconductor device, the plurality of leadfingers, and the interposer, wherein the plurality of leadfingers extend from the packaging material to form pins. The method also includes applying a test signal to at least one of the pins of the integrated circuit. A test result may then be generated based upon an analysis of a signal returned from the integrated circuit.

BRIEF DESCRIPTION OF THE DRAWINGS

The present invention is illustrated by way of example, and not by way of limitation, in the figures of the accompanying drawings and in which like reference numerals refer to similar elements.

FIG. 3A shows an exemplary flip-flop semiconductor device package with etched leadfingers in accordance with one embodiment of the present invention.

FIG. 3B shows an exemplary reduced-profile flip-flop semiconductor device package with etched leadfingers in accordance with one embodiment of the present invention.

FIG. 4A shows an exemplary flip-flop semiconductor device package with an exposed device surface and etched leadfingers in accordance with one embodiment of the present invention.

FIG. 4B shows an exemplary reduced-profile flip-flop semiconductor device package with an exposed device surface and etched leadfingers in accordance with one embodiment of the present invention.

FIG. 6A shows an exemplary flip-flop semiconductor device package with an exposed device surface and deeply-etched leadfingers in accordance with one embodiment of the present invention.

FIG. 6B shows an exemplary reduced-profile flip-flop semiconductor device package with an exposed device surface and deeply-etched leadfingers in accordance with one embodiment of the present invention.

DETAILED DESCRIPTION OF THE INVENTION

Figure 1A:
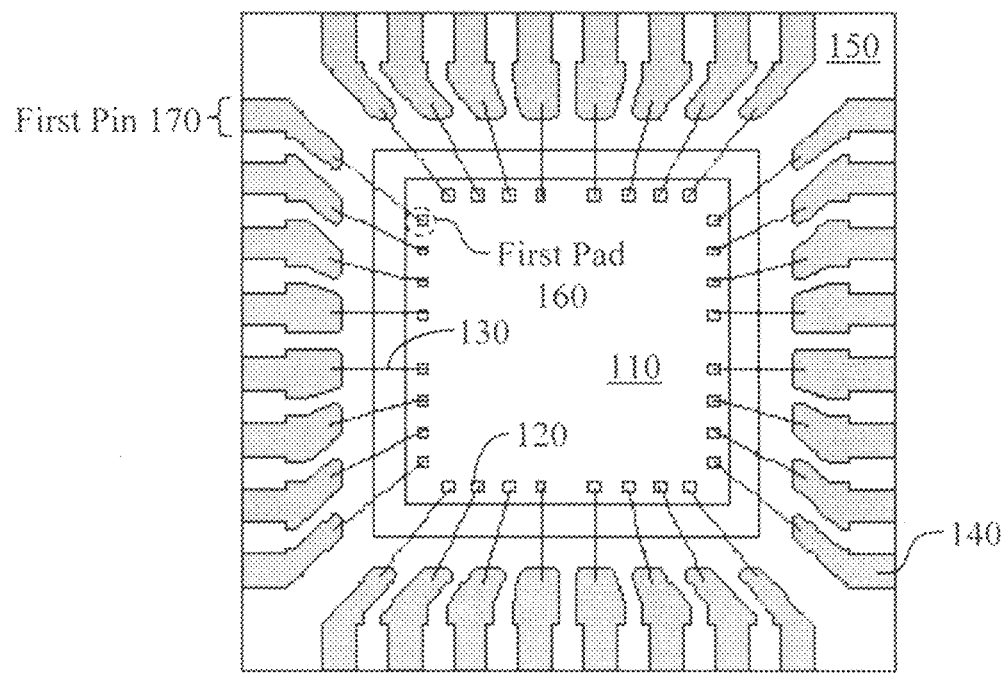
FIGS. 1A and 1B show a conventional wire-bonded semiconductor device package.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Etched Leadfingers Used in Flip-Flop Semiconductor Device Packages

FIG. 3A shows exemplary flip-flop semiconductor device package 300A with etched leadfingers in accordance with one embodiment of the present invention. As shown in FIG. 3A, semiconductor device 310 is coupled to etched surface 325a of leadfinger 320a and etched surface 325b of leadfinger 320b. Conductive elements 330a and 330b may mechanically and/or electrically couple conductive pads (not shown) arranged on surface 316 of device 310 to leadfingers 320a and 320b, thereby providing electrical continuity between leadfingers (e.g., 320a and 320b) of package 300A and conductive pads of device 310. Packaging material 340 may at least partially encapsulate the leadfingers (e.g., 320a and 320b), device (e.g., 310) and any conductive elements (e.g., 330a and 330b) joining the device to the leadfingers. Additionally, leadfingers 320a and/or 320b may protrude from packaging material 340 to form pins of an integrated circuit, thereby enabling use of the integrated circuit in other circuits (e.g., by attaching the pins to a printed circuit board, etc.), testing and/or verification of the integrated circuit, etc.

In one embodiment, device 310 may have a wire-bonded pad arrangement, thereby saving the expense of designing and manufacturing a new device with a different pad arrangement. Additionally, given that device 310 is oriented face-up (e.g., with conductive pads facing upward) instead of face-down like device 210 of FIG. 2, rerouting of signal paths may not be required since the conductive pad arrangement is not mirrored (e.g., like device 210 of FIG. 2) and may match the pin assignment arrangement of the leadfingers (e.g., 320a, 320b, etc.). Package 300A also reduces the signal path length and the number of connections therein by directly coupling the conductive pads of the device (e.g., 310) to the leadfingers (e.g., etched surface 325a of leadfinger 320a and etched surface 325b of leadfinger 320b). Thus, package 300A offers improved signaling properties, durability, reliability, and package density over conventional wire-bonded packages (e.g., 100 of FIG. 1) and flip-flop packages (e.g., 200 of FIG. 2).

As shown in FIG. 3A, device 310 is positioned and coupled beneath the leadfingers in the portion removed during etching (e.g., defined by etched surfaces 325a/325b and etch depths 327a/327b), referred to herein as the "etched portion." By placing the device (e.g., 310) in the etched portion, a reduction in overall package height 350 may be obtained over conventional solutions. Additionally, it should be appreciated that overall package height 350 may be adjusted by varying etch depths 327a/327b, leadfinger heights 329a/329b, device thickness 315, or a combination thereof. In one embodiment, etch depths 327a/327b may be half that of leadfinger heights 329a/329b, thereby creating half-etched leadfingers.

Distance 360 represents the distance between surface 317 of device 310 and the bottom surface of the package (e.g., 300A), which may be varied to alter heat dissipation of device 310, durability/reliability of device 310 and/or the package (e.g., by limiting movement, bending, etc. between device 310 and leadfingers 320a/320b), etc. Distance 360 may be controlled by changing etch depths 327a/327b, leadfinger heights 329a/329b, device thickness 315, or a combination thereof.

Packaging material 340 may fill area between and around the leadfingers (e.g., 320a and 320b), thereby providing support for the leadfingers and/or rigidity for the package (e.g., 300A). Material 340 may also provide heat dissipation for device 310 in one embodiment. Additionally, material 340 may comprise a polymer (e.g., epoxy, etc.), ceramic, etc.

As shown in FIG. 3A, conductive elements 330a and 330b may comprise solder or other conductive material used to provide electrical and/or mechanical coupling. The conductive elements may be applied (e.g., as balls, pellets, etc.) to the device (e.g., 310) and/or the leadfingers (e.g., 320a and/or 320b) before assembly, where the elements may be used to bond the device to the leadfinger during assembly (e.g., by heating, curing, etc. the conductive elements). In one embodiment, elements 330a and/or 330b may couple conductive pads arranged on surface 316 of device 310 to surfaces 325a and/or 325b of leadfingers 320a and/or 320b. Alternatively, conductive elements 330a and/or 330b depicted in FIG. 3A may represent a bond between the materials of the leadfingers (e.g., 320a and 320b) and portions of the device (e.g., 310), where welding or other means are used to bond the materials.

FIG. 3B shows exemplary reduced-profile flip-flop semiconductor device package 300B with etched leadfingers in accordance with one embodiment of the present invention. As shown in FIG. 3B, package 300B is similar to package 300A of FIG. 3A. However, package 300B comprises less packaging material 340 above leadfingers 320a and 320b, thereby reducing the overall height or profile of package 300B (e.g., with overall package height 370) compared with that (e.g., 350) of package 300A. Additionally, in one embodiment, overall package height 370 may be substantially equal to leadfinger heights 329a and/or 329b.

As shown in FIG. 3B, material 340 may be removed to expose portions (e.g., leadfinger surfaces 322a and/or 322b) of the leadfingers (e.g., 320a and/or 320b). Accordingly, the flip-flop configuration of package 300B provides convenient means for providing test points, wire bondouts, or other features electrically coupled to the integrated circuit leadfingers/pins.

Although FIGS. 3A and 3B depict specific leadfinger heights (e.g., 329a and 329b), etch depths (e.g., 327a and 327b), device thicknesses (e.g., 315), and overall package heights (e.g., 350 and 370), it should be appreciated that one or more of these values may be varied in other embodiments. Additionally, although elements of packages 300A and 300B are depicted as simple shapes to simplify the drawing, it should be appreciated that one or more elements of FIG. 3A and/or FIG. 3B may assume alternative shapes in other embodiments.

FIG. 4A shows exemplary flip-flop semiconductor device package 400A with an exposed device surface and etched leadfingers in accordance with one embodiment of the present invention. As shown in FIG. 4A, semiconductor device 310 is coupled to etched surface 325a of leadfinger 420a and etched surface 325b of leadfinger 420b. Conductive elements 330a and 330b may mechanically and/or electrically couple conductive pads (not shown) of device 310 to leadfingers 420a and 420b, thereby providing electrical continuity between leadfingers of package 400A (e.g., 420a and 420b) and conductive pads of device 310. Packaging material 340 may at least partially encapsulate the leadfingers (e.g., 420a and 420b), device (e.g., 310) and any conductive elements (e.g., 330a and 330b) joining the device to the leadfingers. Additionally, leadfingers 420a and/or 420b may protrude from packaging material 340 to form pins on an integrated circuit, thereby enabling use of the integrated circuit in other circuits (e.g., by attaching the pins to a printed circuit board, etc.), testing and/or verification of the integrated circuit, etc.

Package 400A may share one or more similarities with package 300A of FIG. 3A. For example, device 310 may be oriented face-up and may have a wire-bonded pad arrangement, where each pad couples directly to one or more leadfingers (e.g., 420a, 420b, etc.) similar to package 300A of FIG. 3A. As such, package 400A may offer improved signaling properties, durability, reliability, and package density over conventional wire-bonded packages (e.g., 100 of FIG. 1) and flip-chip packages (e.g., 200 of FIG. 2), similar to package 300A. Package 400A also locates the device (e.g., 310) in the etched portion (e.g., defined by etched surfaces 325a/325b and etch depths 427a/427b), thereby providing a reduction in overall package height 450 over conventional solutions. Additionally, etch depths 427a/427b, leadfinger heights 429a/429b, device thickness 315, or a combination thereof, may be varied to further adjust overall package height 450. Further, in one embodiment, etch depths 327a/327b may be half that of leadfinger heights 329a/329b, thereby creating half-etched leadfingers 320a/320b.

As shown in FIG. 4A, surface 317 of device 310 may be at least partially exposed (e.g., not covered by packaging material 340). Since surface 317 may be at least partially accessible from outside package 400A, heat transfer from the device may be increased (e.g., by application of a heatsink to surface 317, etc.). As such, thermal performance of device 310 may be enhanced using package 400A.

Surface 317 of device 310 may be exposed by shifting the surface (e.g., 317) downward in the package, thereby reducing the distance (e.g., 360) between surface 317 and the bottom surface of the package. In one embodiment, surface 317 may be nearly co-planar with the bottom surface of package 400A. Shifting of surface 317 may be accomplished by varying device thickness 315. Alternatively, leadfinger heights 429a/429b and/or etch depths 427a/427b may be varied to shift surface 317. In one embodiment, surface 317 may be shifted while approximately maintaining a ratio between leadfinger heights 429a/429b and etch depths 427a/427b by varying both leadfinger height (e.g., 429a or 429b) and etch depth (e.g., 427a or 427b) in proportion to one another.

FIG. 4B shows exemplary reduced-profile flip-flop semiconductor device package 400B with an exposed device surface and etched leadfingers in accordance with one embodiment of the present invention. As shown in FIG. 4B, package 400B is similar to package 400A of FIG. 4A. However, package 400B comprises less packaging material 340 above leadfingers 420a and 420b, thereby reducing the overall height or profile of package 400B (e.g., with overall package height 470) compared with that (e.g., 450) of package 400A. Additionally, in one embodiment, overall package height 470 may be substantially equal to leadfinger heights 429a and/or 429b.

As shown in FIG. 4B, material 340 may be removed to expose portions (e.g., leadfinger surfaces 322a and 322b) of the leadfingers (e.g., 420a and 420b). Accordingly, the flip-flop configuration of package 400B provides convenient means for providing test points, wire bondouts, or other features electrically coupled to the integrated circuit leadfingers/pins.

Although FIGS. 4A and 4B depict specific leadfinger heights (e.g., 429a and 429b), etch depths (e.g., 427a and 427b), device thicknesses (e.g., 315), and overall package heights (e.g., 450 and 470), it should be appreciated that one or more of these values may be varied in other embodiments. Additionally, although elements of packages 400A and 400B are depicted as simple shapes to simplify the drawing, it should be appreciated that one or more elements of FIG. 4A and/or FIG. 4B may assume alternative shapes in other embodiments.

Figure 5A:
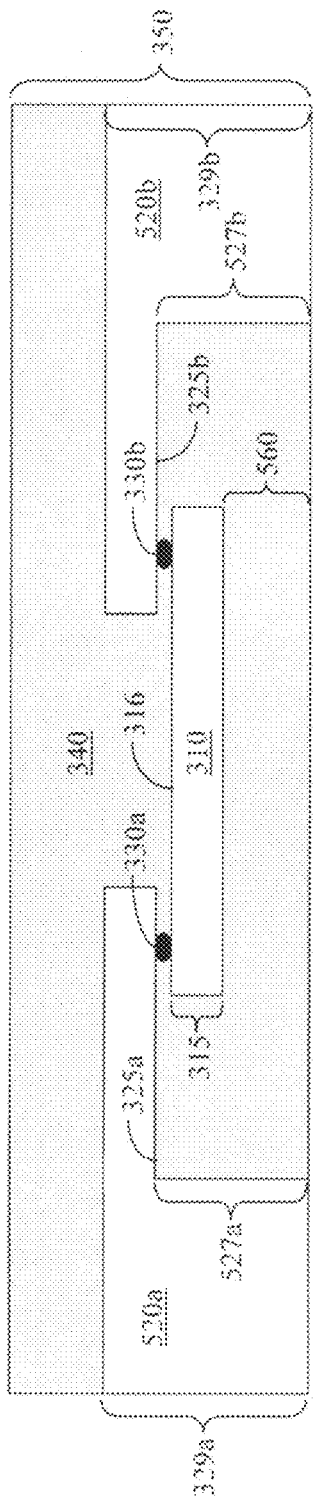
FIG. 5A shows an exemplary flip-flop semiconductor device package with deeply-etched leadfingers in accordance with one embodiment of the present invention.
Figure 5B:
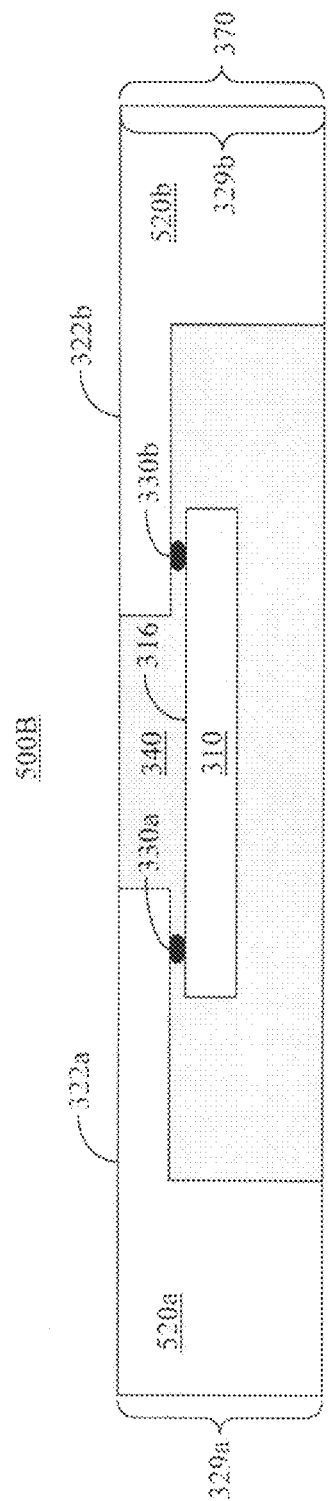
FIG. 5B shows an exemplary reduced-profile flip-flop semiconductor device package with deeply-etched leadfingers in accordance with one embodiment of the present invention.

FIG. 5A shows an exemplary flip-flop semiconductor device package 500A with deeply-etched leadfingers in accordance with one embodiment of the present invention, whereas FIG. 5B shows exemplary reduced-profile flip-flop semiconductor device package 500B with deeply-etched leadfingers in accordance with one embodiment of the present invention. Packages 500A and 500B are similar to packages 300A and 300B of FIGS. 3A and 3B. However, packages 500A and 500B comprise leadfingers 520a and 520b with larger etch depths 527a and 527b than etch depths 327a and 327b of leadfingers 320a and 320b. For example, etch depths 527a/527b may be three-quarters that of leadfinger heights 329a/329b in one embodiment, thereby creating ¾-etched leadfingers 520a/520b. As such, etched surfaces 325a and 325b, to which pads of device 310 are coupled, may be shifted upward in one embodiment, thereby increasing distance 360 to distance 560.

Packages 500A and 500B may share one or more similarities with packages 300A and 300B of FIGS. 3A and 3B. For example, device 310 may be oriented face-up and may have a wire-bonded pad arrangement, where each pad couples directly to one or more leadfingers (e.g., 520a, 520b, etc.) similar to packages 300A to 300B. As such, packages 500A and 500B may offer improved signaling properties, durability, reliability, and package density over conventional wire-bonded packages (e.g., 100 of FIG. 1) and flip-chip packages (e.g., 200 of FIG. 2), similar to packages 300A and 300B. Packages 500A and 500B also locate the device (e.g., 310) in the etched portion (e.g., defined by etched surfaces 325a/325b and etch depths 527a/527b), thereby providing a reduction in overall package height (e.g., 350 and/or 370) over conventional solutions.

FIG. 6A shows exemplary flip-flop semiconductor device package 600A with an exposed device surface and deeply-etched leadfingers in accordance with one embodiment of the present invention, whereas FIG. 6B shows exemplary reduced-profile flip-flop semiconductor device package 600B with an exposed device surface and deeply-etched leadfingers in accordance with one embodiment of the present invention. Packages 600A and 600B are similar to packages 400A and 400B of FIGS. 4A and 4B. However, packages 600A and 600B comprise leadfingers 620a and 620b with larger etch depths 627a and 627b than etch depths 427a and 427b of leadfingers 420a and 420b. For example, etch depths 627a/627b may be three-quarters that of leadfinger heights 429a/429b in one embodiment, thereby creating ¾-etched leadfingers 620a/620b.

Packages 600A and 600B may share one or more similarities with packages 400A and 400B of FIGS. 4A and 4B. For example, device 310 may be oriented face-up and may have a wire-bonded pad arrangement, where each pad couples directly to one or more leadfingers (e.g., 620a, 620b, etc.) similar to packages 400A and 400B. As such, packages 600A and 600B may offer improved signaling properties, durability, reliability, and package density over conventional wire-bonded packages (e.g., 100 of FIG. 1) and flip-chip packages (e.g., 200 of FIG. 2), similar to packages 400A and 400B. Packages 600A and 600B also locate the device (e.g., 310) in the etched portion (e.g., defined by etched surfaces 325a/325b and etch depths 627a/627b), thereby providing a reduction in overall package height (e.g., 450 and/or 470) over conventional solutions.

Additionally, as shown in FIGS. 6A and 6B, surface 317 of device 310 may be at least partially exposed (e.g., not covered by packaging material 340) similar to packages 400A and 400B. As such, thermal performance of device 310 may be enhanced using packages 600A and 600B. Further, surface 317 of device 310 may be exposed in packages 600A and 600B by shifting the surface (e.g., 317) similar to that of packages 400A and 400B (e.g., by varying device thickness 315, leadfinger heights 429a/429b, etch depths 627a/627b, etc.).

Figure 7:
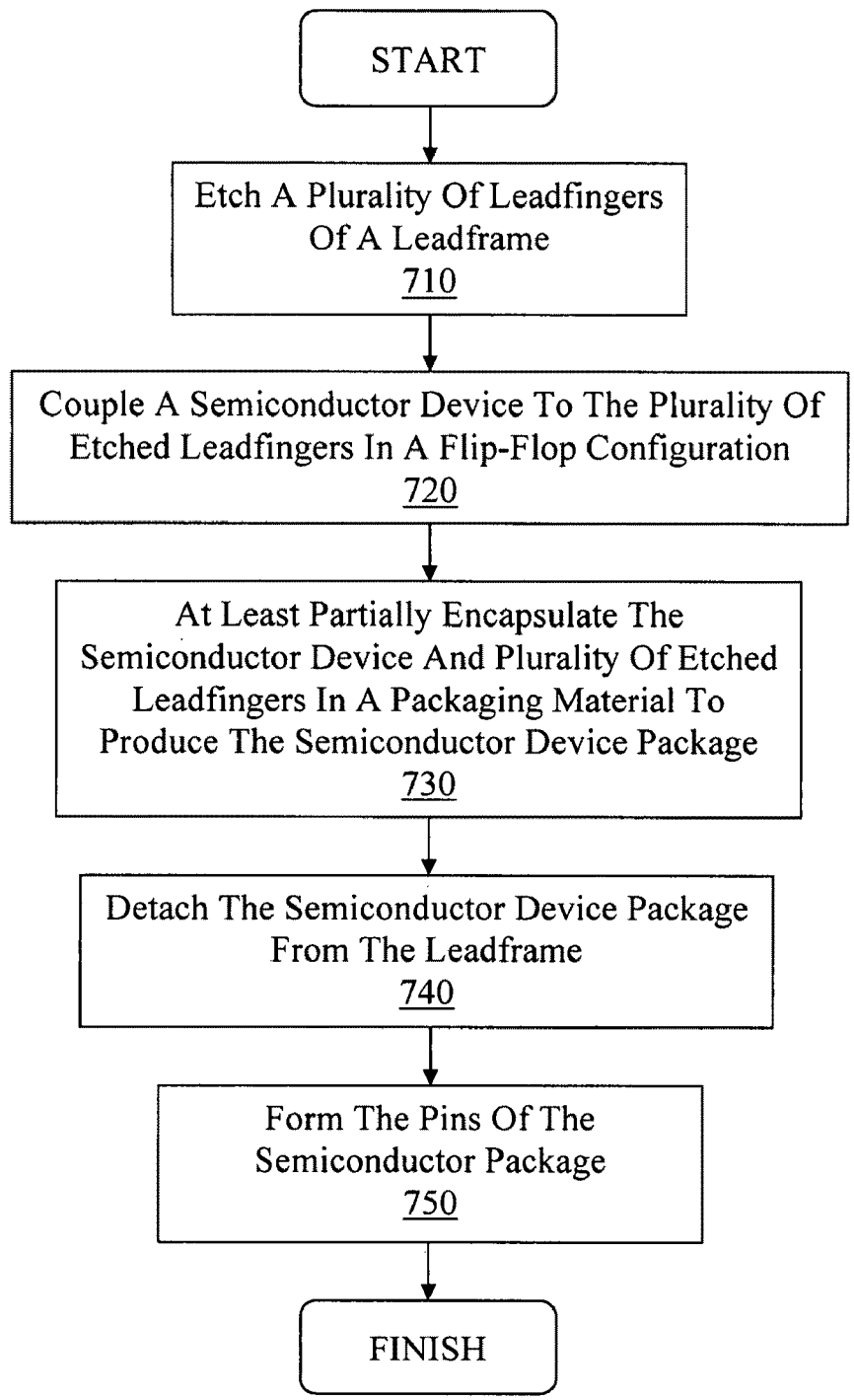
FIG. 7 shows an exemplary process for fabricating a flip-flop semiconductor device package with etched leadfingers in accordance with one embodiment of the present invention.

FIG. 7 shows exemplary process 700 for fabricating a semiconductor device package with etched leadfingers in accordance with one embodiment of the present invention. As shown in FIG. 7, step 710 involves etching a plurality of leadfingers of a leadframe. The leadframe may comprise leadfingers (e.g., 320a, 320b, 420a, 420b, 520a, 520b, 620a, 620b, etc.) allocated to one or more semiconductor device packages (e.g., 300A, 300B, 400A, 400B, 500A, 5006, 600A, 600B, etc.). The leadfingers may comprise respective etched portions with selected etch depths (e.g., 327a, 327b, 427a, 427b, 527a, 527b, 627a, 627b, etc.), where the etch depths may be controlled based upon the application (e.g., to alter the position of a semiconductor device coupled to an etched surface, to alter the package profile, etc.).

Step 720 involves coupling a semiconductor device to a plurality of etched leadfingers in a flip-flop configuration. In one embodiment, the device (e.g., 310) may be coupled to leadfingers (e.g., 320a, 320b, 420a, 420b, 520a, 520b, 620a, 620b, etc.) of a leadframe in a flip-flop configuration as depicted in FIGS. 3A, 3B, 4A, 4B, 5A, 5B, 6A, 6B, or some combination thereof. The device may have a wire-bonded arrangement of conductive pads that may be coupled to the leadfingers by conductive elements (e.g., 330a, 330b, etc.). As such, in one embodiment, the flip-flop configuration may comprise relatively short signaling paths with a limited number of connections to increase signal integrity, durability, reliability, and package density while reducing the expense of the package.

As shown in FIG. 7, step 730 involves at least partially encapsulating the semiconductor device and the plurality of etched leadfingers in a packaging material to produce the semiconductor device package. In one embodiment, packaging material 340 may be used to at least partially encapsulate device 310 and the plurality of etched leadfingers (e.g., 320a, 320b, 420a, 420b, 520a, 520b, 620a, 620b, etc.) coupled thereto. As such, a flip-flop package (e.g., 300A, 300B, 400A, 400B, 500A, 500B, 600A, 600B, etc.) in accordance with FIGS. 3A-6B may be produced.

Step 740 involves detaching the semiconductor package from the leadframe. The leadframe may be cut, sheared, etc. from the package (e.g., 300A, 300B, 400A, 400B, 500A, 500B, 600A, 600B, etc.), where the detached package may comprise an integrated circuit. Additionally, the portions of the etched leadfingers (e.g., 320a, 320b, 420a, 420b, 520a, 520b, 620a, 620b, etc.) extending from the package may comprise pins for attachment to printed circuit boards, for testing/verification, etc.

As shown in FIG. 7, step 750 involves forming the pins of the semiconductor package. In one embodiment, the pins may be bent, cut, or otherwise modified to conform to one or more packaging standards (e.g., surface mount, through-hole, etc.). Alternatively, the pins may be modified to conform to a predetermined specification (e.g., a custom specification supplied by a customer, etc.).

Figure 8:
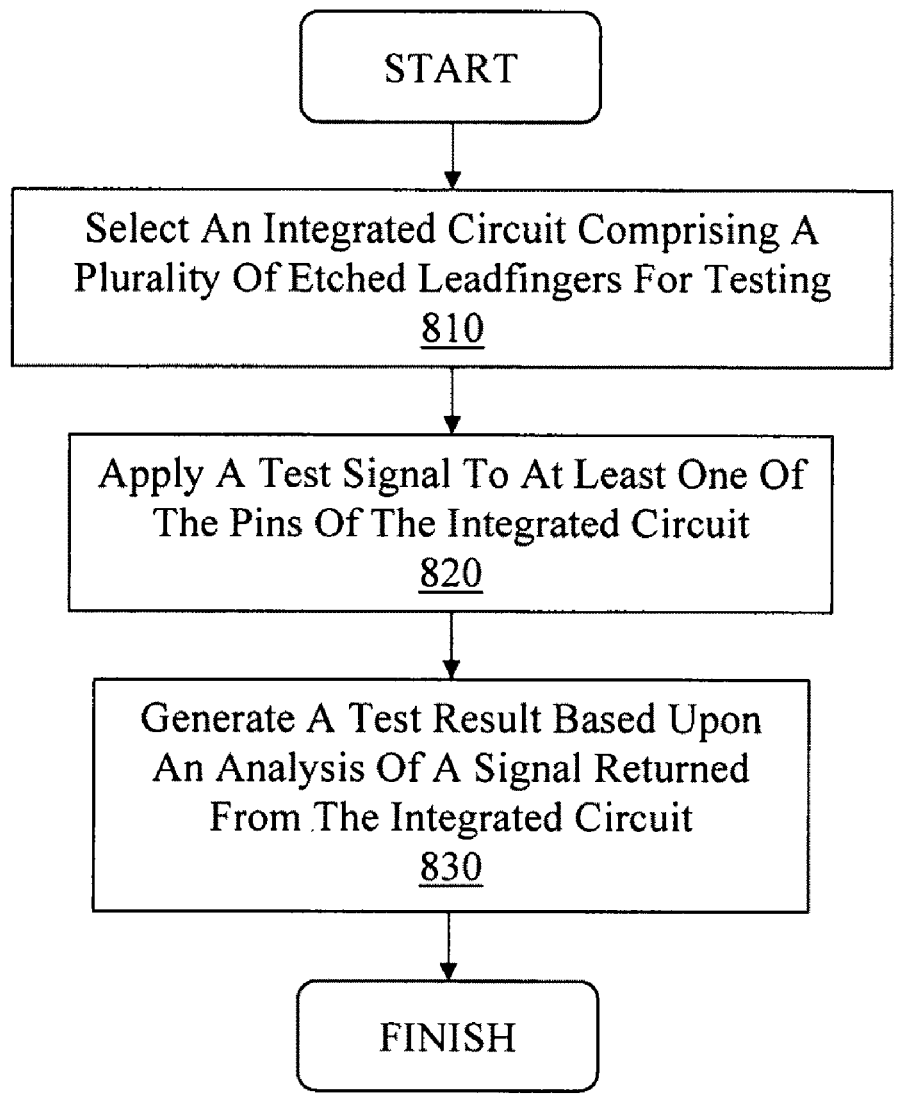
FIG. 8 shows an exemplary process for testing an integrated circuit with etched leadfingers in accordance with one embodiment of the present invention.

FIG. 8 shows an exemplary process 800 for testing an integrated circuit with etched leadfingers in accordance with one embodiment of the present invention. As shown in FIG. 8, step 810 involves identifying an integrated circuit (e.g., a device under test) comprising a plurality of etched leadfingers for testing. The identified integrated circuit may comprise a flip-flop package (e.g., 300A, 300B, 400A, 400B, 500A, 500B, 600A, 600B, etc.) utilizing etched leadfingers (e.g., 320a, 320b, 420a, 420b, 520a, 520b, 620a, 620b, etc.) in one embodiment.

Step 820 involves applying a test signal to at least one of the pins of the integrated circuit. The test signal may comprise one or more test patterns or vectors. Additionally, the testing may analyze functionality, performance (e.g., signal integrity, etc.), or other characteristics of the integrated circuit.

Analysis of a signal returned from the integrated circuit may be used to generate a test result in step 830. In one embodiment, the test result may comprise a generated signal indicating results (e.g., pass/fail, qualitative and/or quantitative analysis, etc.) of the testing. Alternatively, the test result may comprise displayed analysis of the testing of the integrated circuit. And in another embodiment, the displayed analysis may comprise a print out or other hard copy of the results of the testing.

Bent Leadfingers Used in Flip-Flop Semiconductor Device Packages

Figure 9A:
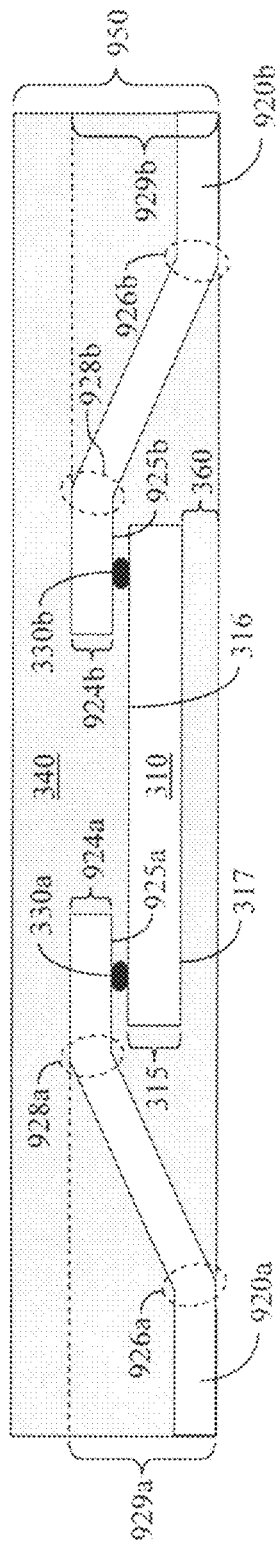
FIG. 9A shows an exemplary flip-flop semiconductor device package with bent leadfingers in accordance with one embodiment of the present invention.

FIG. 9A shows an exemplary flip-flop semiconductor device package 900A with bent leadfingers in accordance with one embodiment of the present invention. As shown in FIG. 9A, semiconductor device 310 is coupled to surface 925a of bent leadfinger 920a and surface 925b of bent leadfinger 920b. Conductive elements 330a and 330b may mechanically and/or electrically couple conductive pads (not shown) of device 310 to leadfingers 320a and 320b, thereby providing electrical continuity between leadfingers (e.g., 920a and 920b) of package 900A and conductive pads of device 310. Packaging material 340 may at least partially encapsulate the leadfingers (e.g., 920a and 920b), device (e.g., 310) and any conductive elements (e.g., 330a and 330b) joining the device to the leadfingers. Additionally, leadfingers 920a and/or 920b may protrude from packaging material 340 to form pins of an integrated circuit, thereby enabling use of the integrated circuit in other circuits (e.g., by attaching the pins to a printed circuit board, etc.), testing and/or verification of the integrated circuit, etc.

In one embodiment, device 310 may have a wire-bonded pad arrangement, thereby saving the expense of designing and manufacturing a new device with a different pad arrangement. Additionally, given that device 310 is oriented face-up (e.g., with conductive pads facing upward) instead of face-down like device 210 of FIG. 2, rerouting of signal paths may not be required since the conductive pad arrangement is not mirrored (e.g., like device 210 of FIG. 2) and may match the pin assignment arrangement of the leadfingers (e.g., 920*a*, 920*b*, etc.). Package 900A also reduces the signal path length and the number of connections therein by directly coupling the conductive pads of the device (e.g., 310) to the leadfingers (e.g., surface 925*a* of bent leadfinger 920*a* and surface 925*b* of bent leadfinger 920*b*). Thus, package 900A offers improved signaling properties, durability, reliability, and package density over conventional wire-bonded packages (e.g., 100 of FIG. 1) and flip-chip packages (e.g., 200 of FIG. 2).

As shown in FIG. 9A, bent leadfingers 920*a* and 920*b* are bent upward via bends 926*a*/926*b* and 928*a*/928*b*. As such, surfaces 925*a* and 925*b* are offset from the bottom surface of the package (e.g., 900A), thereby creating a region beneath the leadfingers for device 310. By placing the device (e.g., 310) in this region, a reduction in overall package height 950 may be obtained over conventional solutions. Additionally, it should be appreciated that overall package height 950 may be adjusted by varying leadfinger heights 929*a*/929*b*, leadfinger thicknesses 924*a*/924*b*, device thickness 315, or a combination thereof.

Although FIG. 9A depicts bent leadfingers 920*a* and 920*b* with only two bends (e.g., 926*a*/926*b* and 928*a*/928*b*), it should be appreciated that leadfingers 920*a* and/or 920*b* may comprise a smaller or larger number of bends in other embodiments. It should also be appreciated that bends 926*a*/926*b* and/or 928*a*/928*b* may comprise different bend angles in other embodiments, where changing the bend angles or other deformation may also change the leadfinger height (e.g., 929*a*, 929*b*, etc.). Additionally, although FIG. 9A depicts leadfingers (e.g., 920*a* and 920*b*) with sharp bends, it should be appreciated that the bends may be radiused or otherwise formed or deformed in other embodiments.

As shown in FIG. 9A, leadfingers 920*a* and 920*b* may have substantially uniform leadfinger thicknesses 924*a* and 924*b* in one embodiment. Alternatively, the thicknesses (e.g., 924*a* and/or 924*b*) of the leadfingers (e.g., 920*a* and/or 920*b*) may vary over their length. Additionally, although the portions of the leadfingers (e.g., 920*a* and/or 920*b*) between and around bends (e.g., 926*a*/926*b* and 928*a*/928*b*) are depicted in FIG. 9A as substantially straight, it should be appreciated that one or more of these portions may be arced, twisted, or otherwise formed or deformed in other embodiments.

Distance 360 represents the distance between surface 317 of device 310 and the bottom surface of the package (e.g., 900A), which may be varied to alter heat dissipation of device 310, durability/reliability of device 310 and/or the package (e.g., by limiting movement, bending, etc. between device 310 and leadfingers 920*a*/920*b*), etc. Distance 360 may be controlled by changing leadfinger heights 929*a*/929*b*, leadfinger thicknesses 924*a*/924*b*, device thickness 315, or a combination thereof.

Figure 9B:
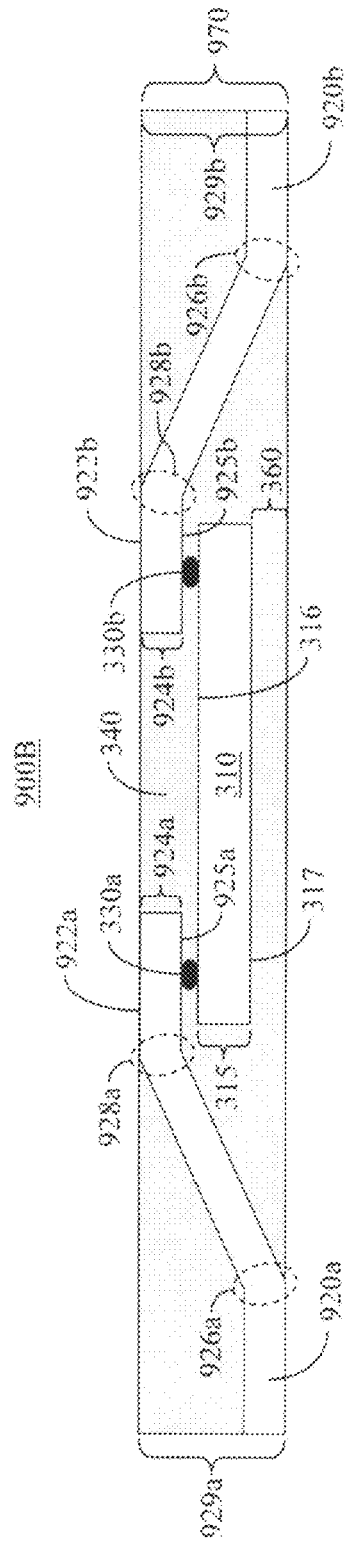
FIG. 9B shows an exemplary reduced-profile flip-flop semiconductor device package with bent leadfingers in accordance with one embodiment of the present invention.

FIG. 9B shows an exemplary reduced-profile flip-flop semiconductor device package 900B with bent leadfingers in accordance with one embodiment of the present invention. As shown in FIG. 9B, package 900B is similar to package 900A of FIG. 9A. However, package 900B comprises less packaging material 340 above leadfingers 920*a* and 920*b*, thereby reducing the overall height or profile of package 900B (e.g., with overall package height 970) compared with that (e.g., 950) of package 900A. Additionally, in one embodiment, overall package height 970 may be substantially equal to leadfinger heights 929*a* and/or 929*b*.

As shown in FIG. 9B, material 340 may be removed to expose portions (e.g., leadfinger surfaces 922*a* and/or 922*b*) of the leadfingers (e.g., 920*a* and/or 920*b*). Accordingly, the flip-flop configuration of package 900B provides convenient means for providing test points, wire bondouts, or other features electrically coupled to the integrated circuit leadfingers/pins.

Although FIGS. 9A and 9B depict specific leadfinger heights (e.g., 929*a* and 929*b*), leadfinger thicknesses (e.g., 924*a* and 924*b*), device thicknesses (e.g., 315), and overall package heights (e.g., 950 and 970), it should be appreciated that one or more of these values may be varied in other embodiments. Additionally, although elements of packages 900A and 900B are depicted as simple shapes to simplify the drawing, it should be appreciated that one or more elements of FIG. 9A and/or FIG. 9B may assume alternative shapes in other embodiments.

Figure 10A:
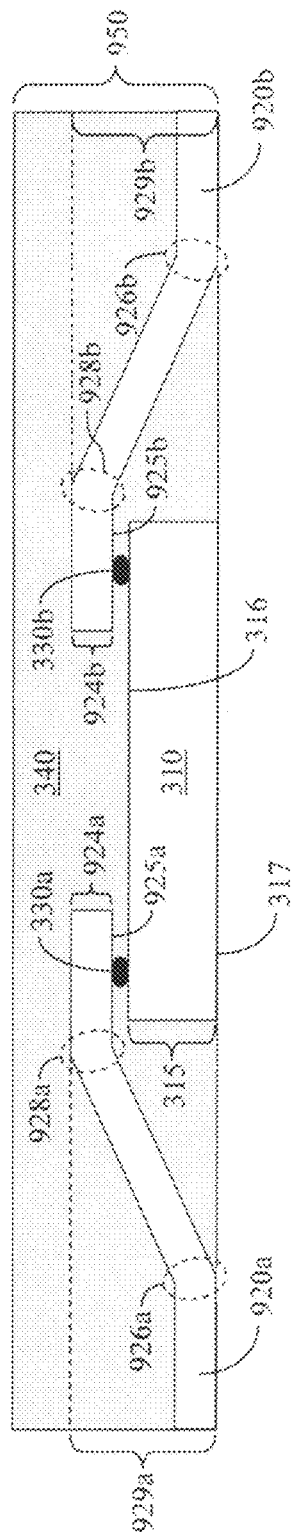
FIG. 10A shows an exemplary flip-flop semiconductor device package with an exposed device surface and bent leadfingers in accordance with one embodiment of the present invention.

FIG. 10A shows exemplary flip-flop semiconductor device package 400A with an exposed device surface and bent leadfingers in accordance with one embodiment of the present invention. As shown in FIG. 10A, package 1000A may share one or more similarities with package 900A of FIG. 9A. For example, device 310 may be oriented face-up and may have a wire-bonded pad arrangement, where each pad couples directly to one or more leadfingers (e.g., 920*a*, 920*b*, etc.) similar to package 900A of FIG. 9A. As such, package 1000A may offer improved signaling properties, durability, reliability, and package density over conventional wire-bonded packages (e.g., 100 of FIG. 1) and flip-chip packages (e.g., 200 of FIG. 2), similar to package 900A. Package 1000A also locates the device (e.g., 310) in the region beneath the upwardly bent leadfingers (e.g., 920*a* and 920*b*), thereby providing a reduction in overall package height 950 over conventional solutions. Additionally, leadfinger heights 929*a*/929*b*, leadfinger thicknesses 924*a*/924*b*, device thickness 315, or a combination thereof, may be varied to further adjust overall package height 950.

As shown in FIG. 10A, surface 317 of device 310 may be at least partially exposed (e.g., not covered by packaging material 340). Since surface 317 may be at least partially accessible from outside package 1000A, heat transfer from the device may be increased (e.g., by application of a heatsink to surface 217, etc.). As such, thermal performance of device 310 may be enhanced using package 1000A.

Surface 317 of device 310 may be exposed by shifting the surface (e.g., 317) downward in the package, thereby reducing the distance (e.g., 360) between surface 317 and the bottom surface of the package. In one embodiment, surface 317 may be nearly co-planar with the bottom surface of package 1000A. Shifting of surface 317 may be accomplished by varying device thickness 315. Alternatively, leadfinger heights 929*a*/929*b* and/or leadfinger thicknesses 924*a*/924*b* may be varied to shift surface 317.

Figure 10B:
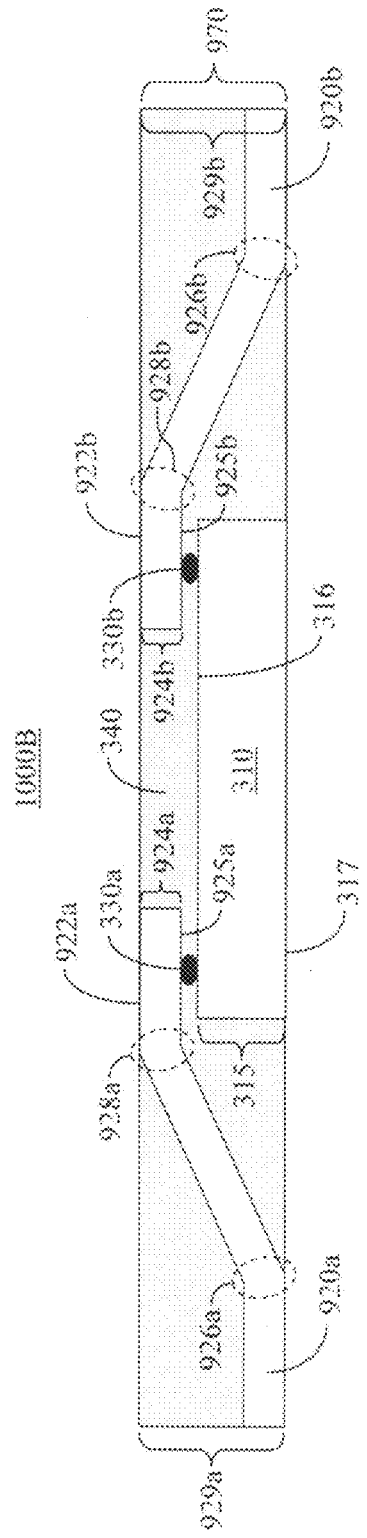
FIG. 10B shows an exemplary reduced-profile flip-flop semiconductor device package with an exposed device surface and bent leadfingers in accordance with one embodiment of the present invention.

FIG. 10B shows exemplary reduced-profile flip-flop semiconductor device package 1000B with an exposed device surface and bent leadfingers in accordance with one embodiment of the present invention. As shown in FIG. 10B, package 1000B is similar to package 1000A of FIG. 10A. However, package 1000B comprises less packaging material 340 above leadfingers 920*a* and 920*b*, thereby reducing the overall height or profile of package 1000B (e.g., with overall package height 970) compared with that (e.g., 950) of package 1000A. Additionally, in one embodiment, overall package height 970 may be substantially equal to leadfinger heights 929*a* and/or 929*b*.

As shown in FIG. 10B, material 340 may be removed to expose portions (e.g., leadfinger surfaces 922*a* and 922*b*) of the leadfingers (e.g., 920*a* and 920*b*). Accordingly, the flip-flop configuration of package 1000B provides convenient means for providing test points, wire bondouts, or other features electrically coupled to the integrated circuit leadfingers/pins.

Although FIGS. 10A and 10B depict specific leadfinger heights (e.g., 929a and 929b), leadfinger thicknesses (e.g., 924a and 924b), device thicknesses (e.g., 315), and overall package heights (e.g., 950 and 970), it should be appreciated that one or more of these values may be varied in other embodiments. Additionally, although elements of packages 1000A and 1000B are depicted as simple shapes to simplify the drawing, it should be appreciated that one or more elements of FIG. 10A and/or FIG. 10B may assume alternative shapes in other embodiments.

Figure 11:
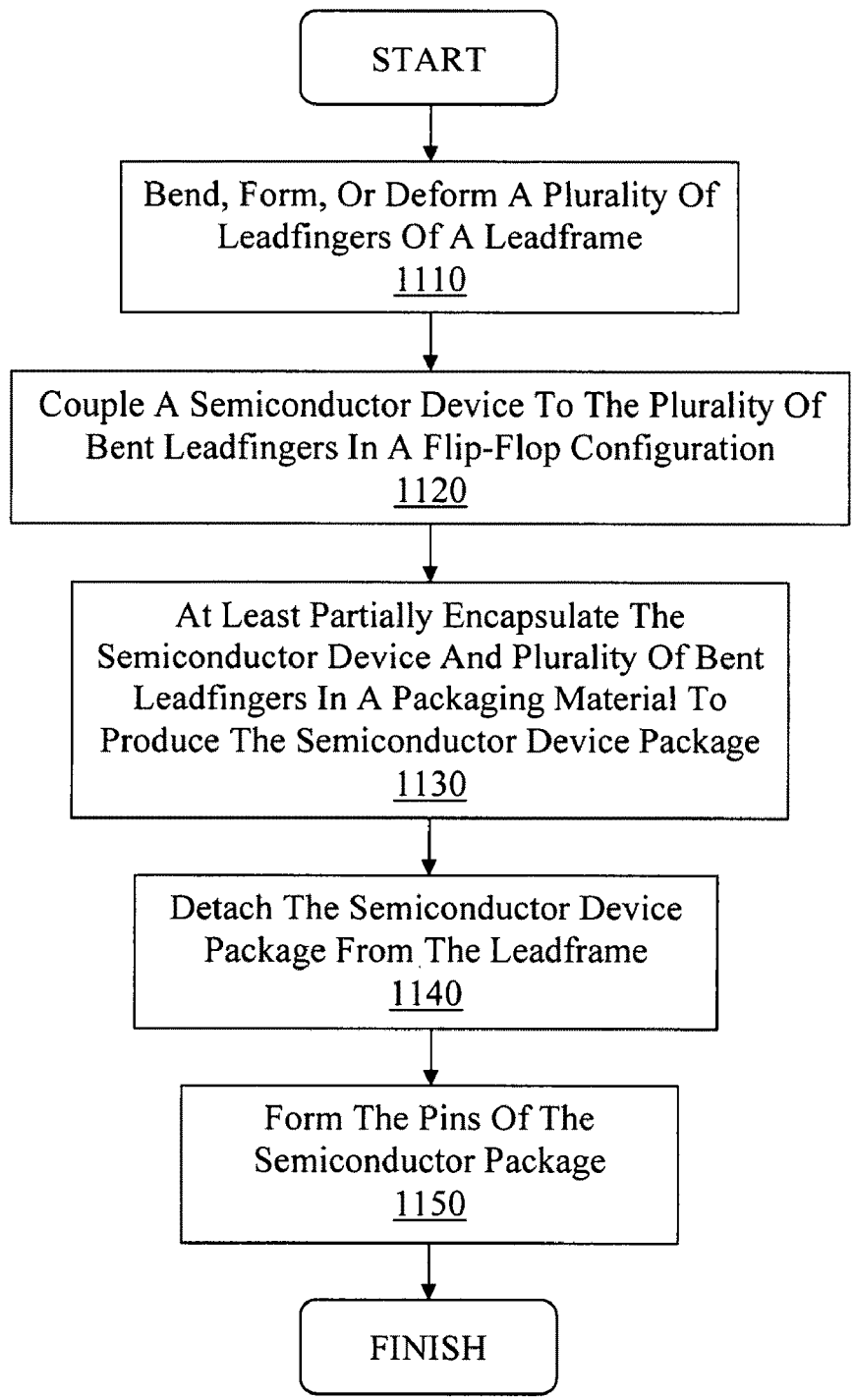
FIG. 11 shows an exemplary process for fabricating a semiconductor device package with bent leadfingers in accordance with one embodiment of the present invention.

FIG. 11 shows exemplary process 1100 for fabricating a semiconductor device package with bent leadfingers in accordance with one embodiment of the present invention. As shown in FIG. 11, step 1110 involves bending, forming or deforming a plurality of leadfingers of a leadframe. The leadframe may comprise leadfingers (e.g., 920a, 920b, etc.) allocated to one or more semiconductor device packages (e.g., 900A, 900B, 1000A, 1000B, etc.). The leadfingers may comprise respective bends (e.g., 926a, 926b, 928a, 928b, etc.), where the bends may be controlled based upon the application (e.g., to alter the position of a semiconductor device coupled to a leadfinger surface, to alter the package profile, etc.).

Step 1120 involves coupling a semiconductor device to a plurality of bent leadfingers in a flip-flop configuration. In one embodiment, the device (e.g., 310) may be coupled to leadfingers (e.g., 920a, 920b, etc.) of a leadframe in a flip-flop configuration as depicted in FIGS. 9A, 9B, 10A, 10B, or some combination thereof. The device may have a wire-bonded arrangement of conductive pads that may be coupled to the leadfingers by conductive elements (e.g., 330a, 330b, etc.). As such, in one embodiment, the flip-flop configuration may comprise relatively short signaling paths with a limited number of connections to increase signal integrity, durability, reliability, and package density while reducing the expense of the package.

As shown in FIG. 11, step 1130 involves at least partially encapsulating the semiconductor device and the plurality of bent leadfingers in a packaging material to produce the semiconductor device package. In one embodiment, packaging material 340 may be used to at least partially encapsulate device 310 and the plurality of bent leadfingers (e.g., 920a, 920b, etc.) coupled thereto. As such, a flip-flop package (e.g., 900A, 900B, 1000A, 1000B, etc.) in accordance with FIGS. 9A-10B may be produced.

Step 1140 involves detaching the semiconductor package from the leadframe. The leadframe may be cut, sheared, etc. from the package (e.g., 900A, 900B, 1000A, 1000B, etc.), where the detached package may comprise an integrated circuit. Additionally, the portions of the bent leadfingers (e.g., 920a, 920b, etc.) extending from the package may comprise pins for attachment to printed circuit boards, for testing/verification, etc.

As shown in FIG. 11, step 1150 involves forming the pins of the semiconductor package. In one embodiment, the pins may be bent, formed, deformed, cut, or otherwise modified to conform to one or more packaging standards (e.g., surface mount, through-hole, etc.). Alternatively, the pins may be modified to conform to a predetermined specification (e.g., a custom specification supplied by a customer, etc.).

Figure 12:
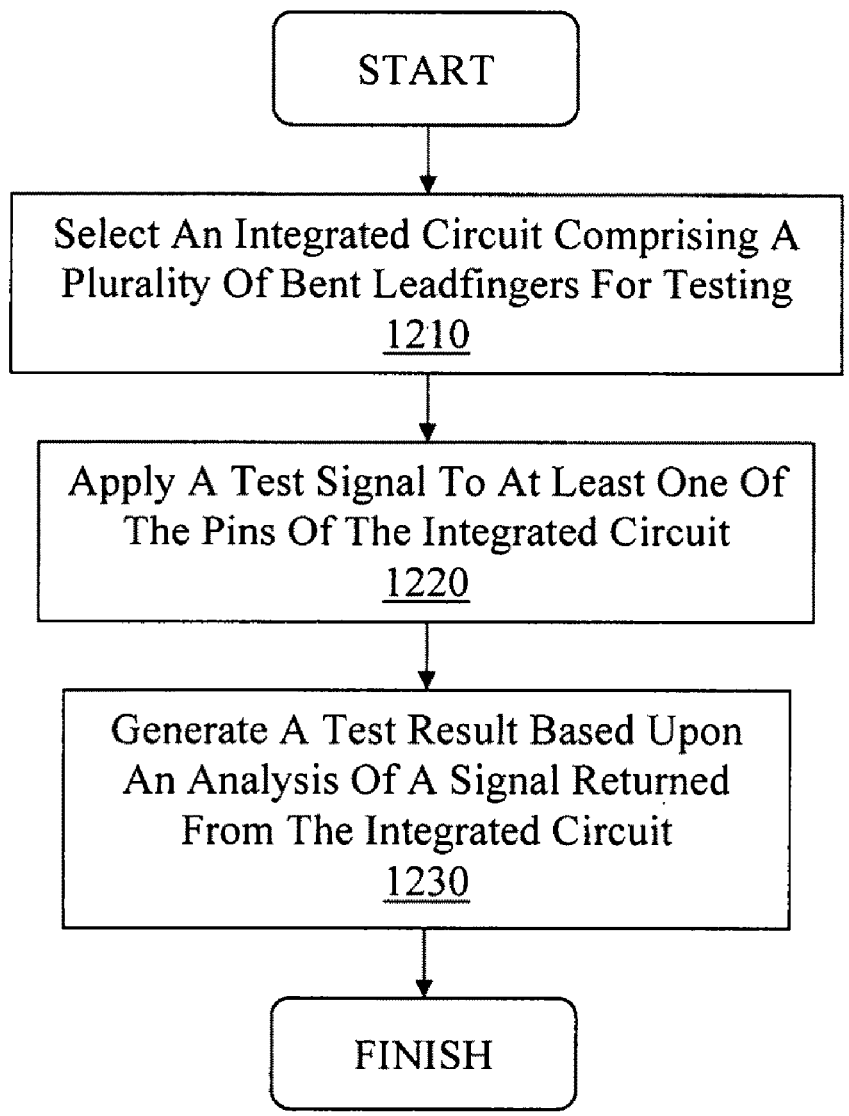
FIG. 12 shows an exemplary process for testing an integrated circuit with bent leadfingers in accordance with one embodiment of the present invention.

FIG. 12 shows exemplary process 1200 for testing an integrated circuit with bent leadfingers in accordance with one embodiment of the present invention. As shown in FIG. 12, step 1210 involves identifying an integrated circuit (e.g., a device under test) comprising a plurality of bent leadfingers for testing. The identified integrated circuit may comprise a flip-flop package (e.g., 900A, 900B, 1000A, 1000B, etc.) utilizing bent leadfingers (e.g., 920a, 920b, etc.) in one embodiment.

Step 1220 involves applying a test signal to at least one of the pins of the integrated circuit. The test signal may comprise one or more test patterns or vectors. Additionally, the testing may analyze functionality, performance (e.g., signal integrity, etc.), or other characteristics of the integrated circuit.

Analysis of a signal returned from the integrated circuit may be used to generate a test result in step 1230. In one embodiment, the test result may comprise a generated signal indicating results (e.g., pass/fail, qualitative and/or quantitative analysis, etc.) of the testing. Alternatively, the test result may comprise displayed analysis of the testing of the integrated circuit. And in another embodiment, the displayed analysis may comprise a print out or other hard copy of the results of the testing.

Interposers Used in Flip-Flop Semiconductor Device Packages

Figure 13:
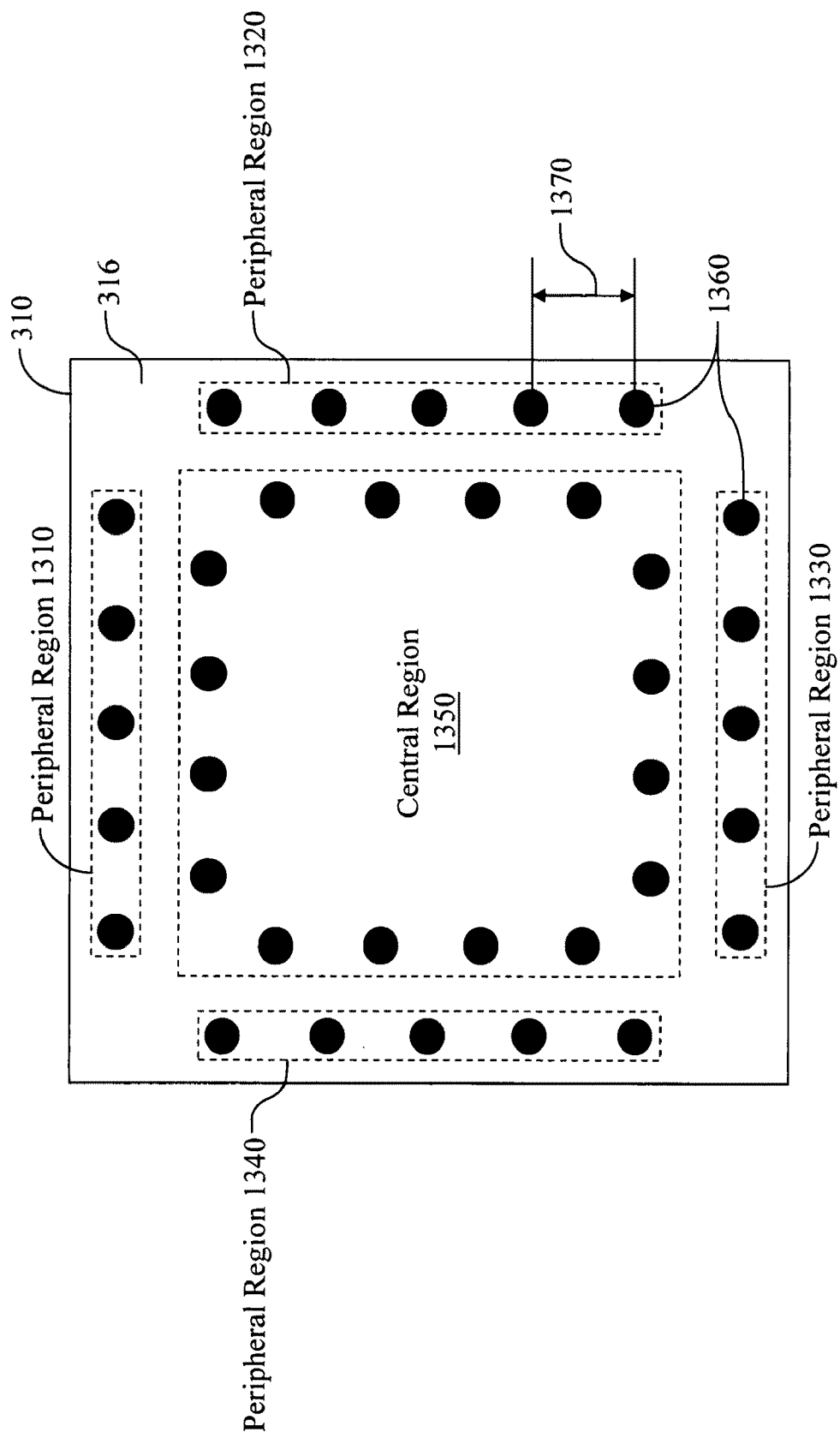
FIG. 13 shows an exemplary semiconductor device with conductive pads arranged in central and peripheral regions in accordance with one embodiment of the present invention.

FIG. 13 shows exemplary semiconductor device 310 with conductive pads arranged in central and peripheral regions in accordance with one embodiment of the present invention. As shown in FIG. 13, surface 316 of device 310 comprises four peripheral regions (e.g., 1310-1340) located toward the periphery of device 310, where each peripheral region comprises conductive pads 1360. The conductive pads (e.g., 1360) may be electrically coupled to terminals (not shown) of device 310, thereby enabling signaling with the device terminals (e.g., when placed in a semiconductor device package). Additionally, central region 1350 of surface 316 is located within or between the peripheral regions (e.g., 1310-1340) and also comprises conductive pads 1360.

Device 310 may be physically smaller than conventional devices with a similar number of terminals given that the pad density of device 310 may be larger than that of conventional devices. For example, conductive pads (e.g., 1360) may be placed within central region 1350 as well as the peripheral regions (e.g., 1310-1340), thereby enabling the placement of more pads per unit of surface area of surface 316. Additionally, bump pitch 1370 (e.g., the distance between two adjacent conductive pads 1360) of device 310 may be finer or smaller than conventional devices which may also increase pad density. Thus, by reducing the size of device 310, the package density of semiconductor device packages using device 310 may be increased.

Although FIG. 13 depicts a specific number of regions and a number of conductive pads within each region, it should be appreciated that a larger or smaller number of regions and/or number of conductive pads within each region may be used in other embodiments. Additionally, although FIG. 13 depicts surface 316 with specific types of regions (e.g., central, peripheral, etc.), it should be appreciated that surface 316 may comprise other types of regions (e.g., intermediary, etc.) in other embodiments. Further, although FIG. 13 depicts a specific arrangement of conductive pads within each region, it should be appreciated that the conductive pads (e.g., 1360) may be alternatively arranged in other embodiments.

Figure 1B:
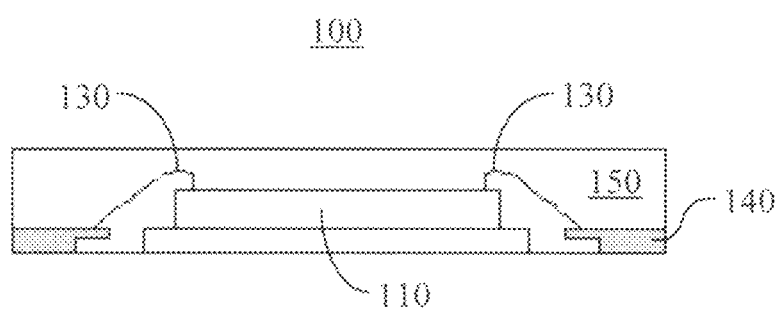
Figure 2A:
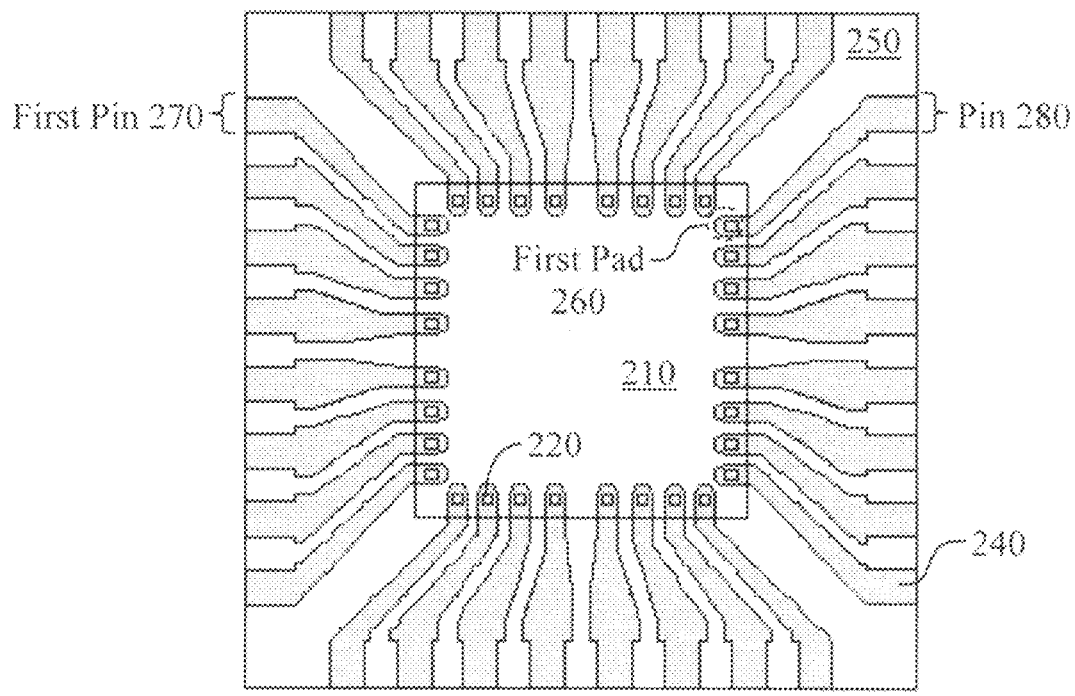
FIGS. 2A and 2B show a conventional flip-chip semiconductor device package.
Figure 2B:
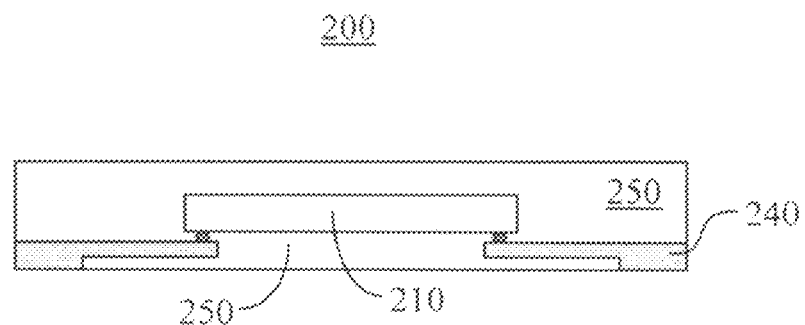
Figure 14:
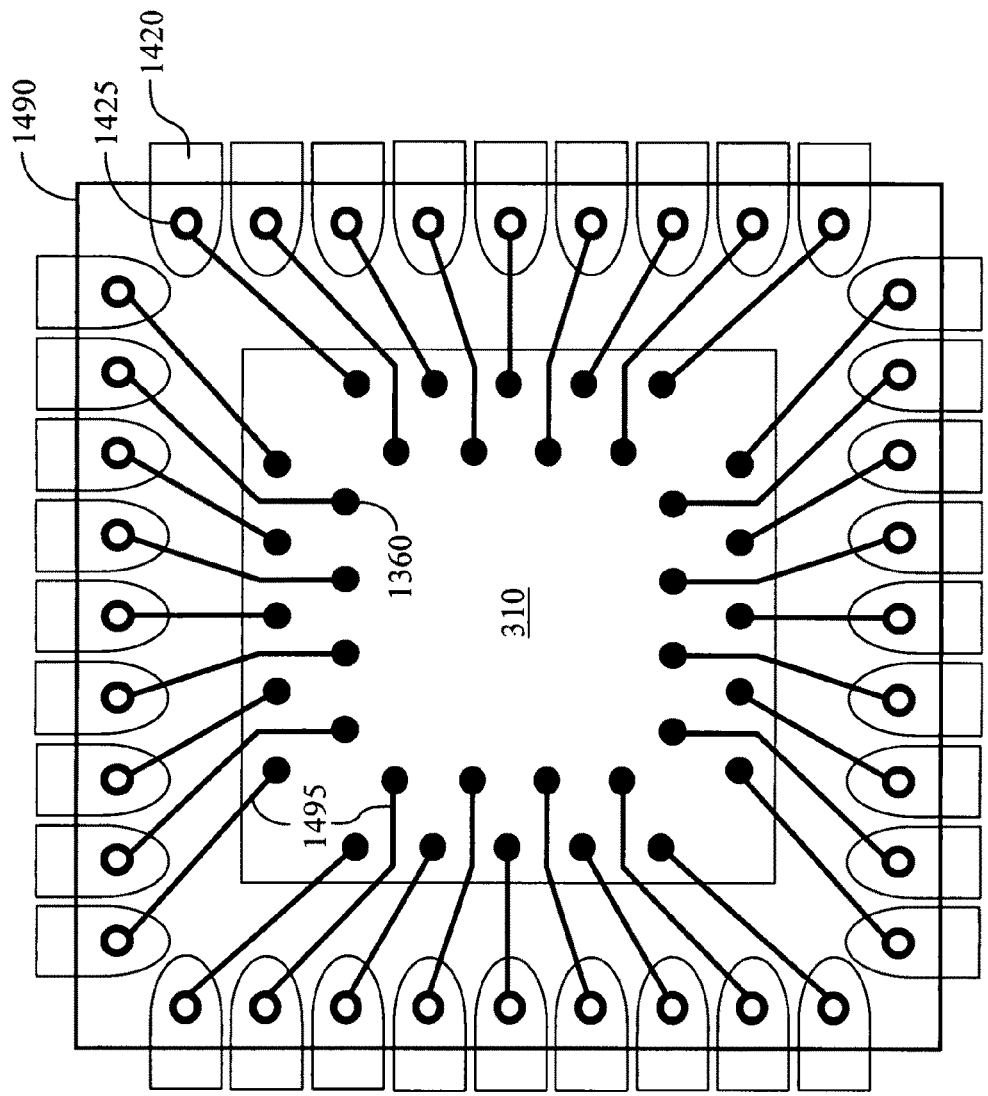
FIG. 14 shows an exemplary interposer coupling conductive pads of a semiconductor device to conductive surfaces of a plurality of leadfingers in accordance with one embodiment of the present invention.

FIG. 14 shows exemplary interposer 1490 coupling conductive pads of a semiconductor device to conductive surfaces of a plurality of leadfingers in accordance with one embodiment of the present invention. As shown in FIG. 14, conductive traces 1495 of interposer 1490 may electrically couple conductive pads 1360 of device 310 to conductive surfaces 1425 of leadfingers 1420. The traces (e.g., 1495) may be routed between conductive pads of device 310, thereby enabling conductive pads 1360 located in a central region (e.g., 1350) of device 310 to be coupled to leadfingers 1420. Additionally, using traces (e.g., 1495) may provide enhanced reliability and durability over conventional solutions (e.g., utilizing wire-bonding as shown in FIG. 1, etc.).

Device 310 may be placed between leadfingers 1420 in a flip-flop configuration such that conductive pads 1360 and conductive surfaces 1425 are in approximately the same plane, thereby enabling a single surface of interposer 1490 to couple to both device 310 and leadfingers 1420. In one embodiment, interposer 1490 may comprise a single-sided printed circuit board (PCB) where traces 1495 are formed from a single metal layer of the PCB. Alternatively, interposer 1490 may comprise multiple layers. As such, interposer 1490 may be manufactured cheaply and efficiently.

In addition to its low cost, interposer 1490 may also be configurable. For example, characteristics (e.g., the shape, length, width, etc.) of traces 1495 may be varied to affect (e.g., change, tune, etc.) signals passed through the traces. In one embodiment, the layout of traces 1495 may provide improved signal integrity (e.g., by reducing impedance mismatches, crosstalk, etc.). Additionally, interposer 1490 may accept one or more passive and/or active components coupled to traced 1495 (e.g., soldered to pads not depicted in FIG. 13), thereby enabling signals passed through traces 1495 to be further configured. Further, interposer 1490 may be used to reduce interference or noise (e.g., by forming a ground plane around traces 1495, by using additional layers of interposer 1490 to form a ground plane, etc.).

Although FIG. 14 depicts interposer with a specific number of traces 1495, it should be appreciated that a larger or smaller number of traces may be used in other embodiments. Additionally, although FIG. 14 depicts a specific routing of traces 1495, it should be appreciated that the traces (e.g., 1495) may be alternatively routed in other embodiments. Further, it should be appreciated that interposer 1490 may be used with devices and/or leadfingers with different sizes, shapes, characteristics, etc. in other embodiments.

Figure 15A:
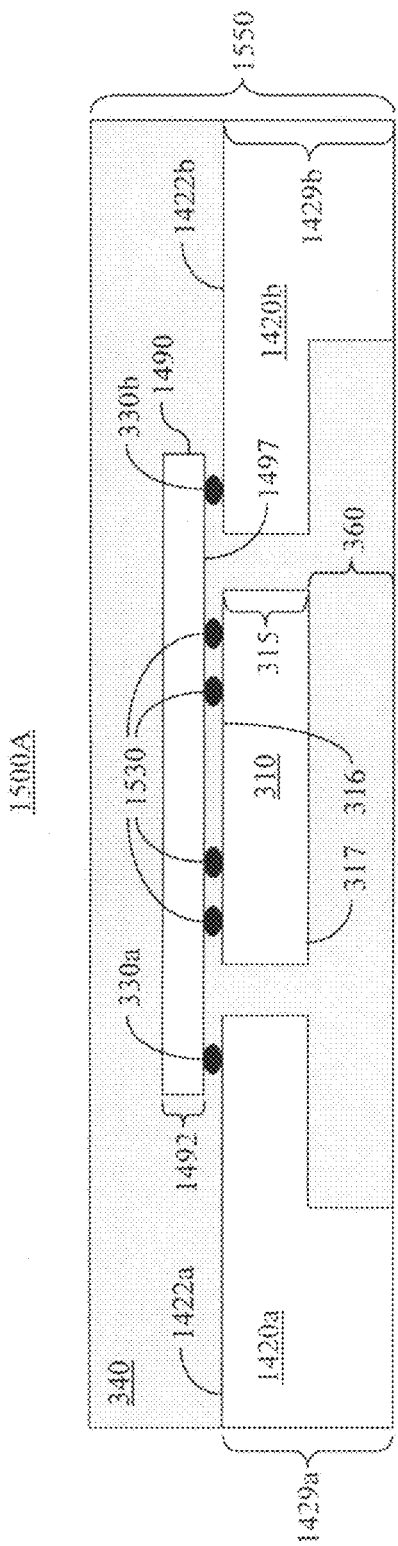
FIG. 15A shows an exemplary flip-flop semiconductor device package with an interposer in accordance with one embodiment of the present invention.

FIG. 15A shows exemplary flip-flop semiconductor device package 1500A with an interposer in accordance with one embodiment of the present invention. As shown in FIG. 15A, interposer 1490 electrically and/or mechanically couples to surface 1422a of leadfinger 1420a (e.g., via conductive element 330a), surface 1422b of leadfinger 1420b (e.g., via conductive element 330b), and surface 316 of semiconductor device 310 (e.g., via conductive elements 1530) oriented face-up in a flip-flop configuration. Leadfingers 1420a and/or 1420b may function similarly to leadfingers 1420, and may be etched (e.g., similar to leadfingers 320a/320b, etc.), bent (e.g., similar to leadfingers 920a/920b, etc.), etc. Conductive elements 1530 may function similarly to conductive elements 330a and/or 330b as described with respect to previous figures. Accordingly, interposer 1490 may couple conductive pads (e.g., 1360 disposed on surface 316) of semiconductor device 310 to conductive surfaces (e.g., 1425 disposed on surfaces 1422a and/or 1422b) of leadfingers 1420a and/or 1420b, thereby enabling signaling between leadfingers 1420a/1420b and device 310.

As shown in FIG. 15A, packaging material 340 may at least partially encapsulate the leadfingers (e.g., 1420a and 1420b), device (e.g., 310), interposer (e.g., 1490), and any conductive elements (e.g., 330a, 330b and 1530) joining the device, leadfingers, or interposer. Additionally, leadfingers 1420a and/or 1420b may protrude from packaging material 340 to form pins of an integrated circuit, thereby enabling use of the integrated circuit in other circuits (e.g., by attaching the pins to a printed circuit board, etc.), testing and/or verification of the integrated circuit, etc.

In addition to the advantages discussed with respect to FIG. 14, interposer 1490 may also provide a reduced package height 1550 for package 1500A compared with conventional solutions. As shown in FIG. 15A, device 310 is positioned beneath interposer 1490 and between leadfingers 1420a and 1420b. As such, package 1500A utilizes the region between the leadfingers that conventional solutions (e.g., flip-chip package 200 of FIG. 2) do not, thereby reducing the overall package height 1550 compared with convention solutions. It should be appreciated that interposer thickness 1492 may be small (e.g., relative to overall package height 1550), and therefore may contribute little, if any, to overall package thickness 1550. Additionally, it should be appreciated that interposer thickness 1492 may be smaller than the thickness of components (not shown in FIG. 2) placed between the leadfingers and the device in conventional flip-chip solutions to re-route signal paths, thereby further reducing overall package height 1550 over conventional solutions. Further, it should be appreciated that overall package height 1550 may be adjusted by varying interposer thickness 1492, leadfinger heights 1429a/1429b, device thickness 315, or a combination thereof.

Distance 360 represents the distance between surface 317 of device 310 and the bottom surface of the package (e.g., 1500A), which may be varied to alter heat dissipation of device 310, durability/reliability of device 310 and/or the package (e.g., by limiting movement, bending, etc. between device 310 and leadfingers 1420a/1420b), etc. Distance 360 may be controlled by changing leadfinger heights 1429a/1429b and/or device thickness 315.

Figure 15B:
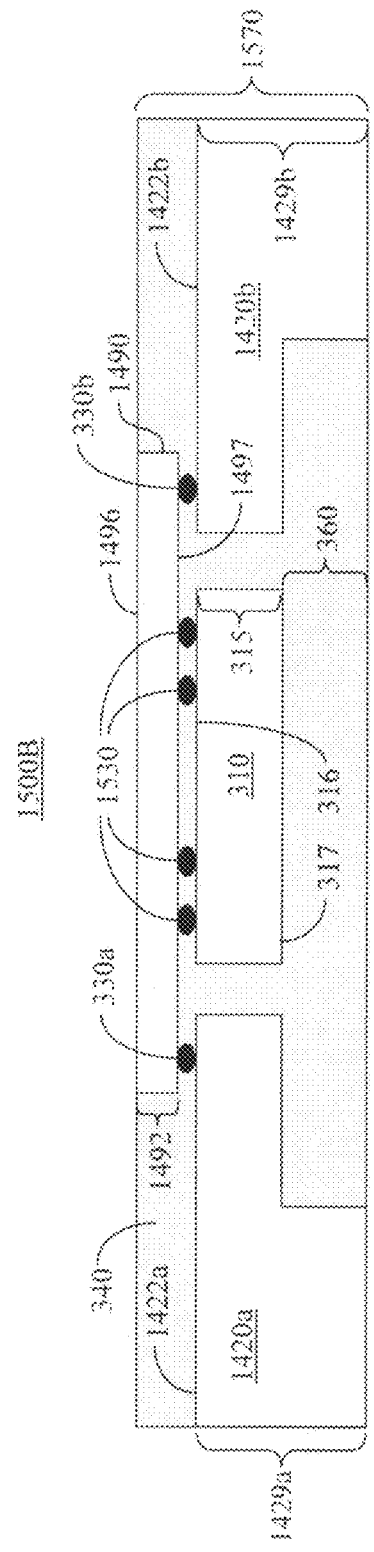
FIG. 15B shows an exemplary reduced-profile flip-flop semiconductor device package with an interposer in accordance with one embodiment of the present invention.

FIG. 15B shows exemplary reduced-profile flip-flop semiconductor device package 1500B with an interposer in accordance with one embodiment of the present invention. As shown in FIG. 15B, package 1500B is similar to package 1500A of FIG. 15A. However, package 1500B comprises less packaging material 340 above interposer 1490, thereby reducing the overall height or profile of package 1500B (e.g., with overall package height 1570) compared with that (e.g., 1550) of package 1500A. Additionally, in one embodiment, overall package height 1570 may be substantially equal to leadfinger heights 1429a and/or 1429b (e.g., where interposer thickness 1492 is small compared with leadfinger heights 1429a/1429b and/or overall package height 1570).

As shown in FIG. 15B, material 340 may be removed to expose portions (e.g., interposer surface 1496) of the interposer (e.g., 1490). In one embodiment, surface 1496 may comprise traces, pads, vias, etc. that are electrically coupled to terminals of device 310 and/or leadfingers 1420a/1420b. Accordingly, the flip-flop configuration of package 1500B provides convenient means for providing test points, wire bondouts, or other features electrically coupled to the interposer and/or integrated circuit leadfingers/pins.

Although FIGS. 15A and 15B depict specific leadfinger heights (e.g., 1429a and 1429b), interposer thicknesses (e.g., 1492), device thicknesses (e.g., 315), and overall package heights (e.g., 1550 and 1570), it should be appreciated that one or more of these values may be varied in other embodiments. Additionally, although elements of packages 1500A and 1500B are depicted as simple shapes to simplify the drawing, it should be appreciated that one or more elements of FIG. 15A and/or FIG. 15B may assume alternative shapes in other embodiments.

Figure 16A:
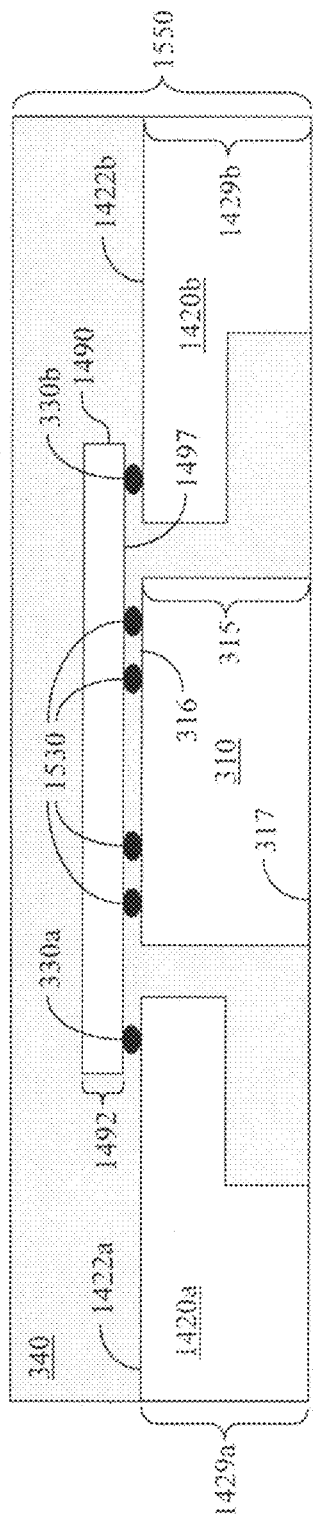
FIG. 16A shows an exemplary flip-flop semiconductor device package with an exposed device surface and an interposer in accordance with one embodiment of the present invention.

FIG. 16A shows exemplary flip-flop semiconductor device package 1600A with an exposed device surface and an interposer in accordance with one embodiment of the present invention. As shown in FIG. 16A, package 1600A may share one or more similarities with package 1500A of FIG. 15A. For example, package 1600A utilizes interposer 1490 for coupling conductive pads (e.g., 1360) of device 310 to leadfingers (e.g., 1420a and 1420b) similar to package 1500A of FIG. 15A. As such, package 1600A may also offer improved signaling properties, durability, reliability, and package density at reduced cost compared to conventional solutions, similar to package 1500A. Package 1600A also locates the device (e.g., 310) in the region beneath the interposer (e.g., 1490) and between the leadfingers (e.g., 1420a and 1420b), thereby providing a reduction in overall package height 1550 over conventional solutions. Additionally, interposer thickness 1492, leadfinger heights 1429a/1429b, device thickness 315, or a combination thereof, may be varied to further adjust overall package height 950.

As shown in FIG. 16A, surface 317 of device 310 may be at least partially exposed (e.g., not covered by packaging material 340). Since surface 317 may be at least partially accessible from outside package 1600A, heat transfer from the device may be increased (e.g., by application of a heatsink to surface 317, etc.). As such, thermal performance of device 310 may be enhanced using package 1600A.

Surface 317 of device 310 may be exposed by shifting the surface (e.g., 317) downward in the package, thereby reducing the distance (e.g., 360) between surface 317 and the bottom surface of the package. In one embodiment, surface 317 may be nearly co-planar with the bottom surface of package 1600A. Shifting of surface 317 may be accomplished by varying device thickness 315. Alternatively, leadfinger heights 1429a/1429b may be varied to shift surface 317.

Figure 16B:
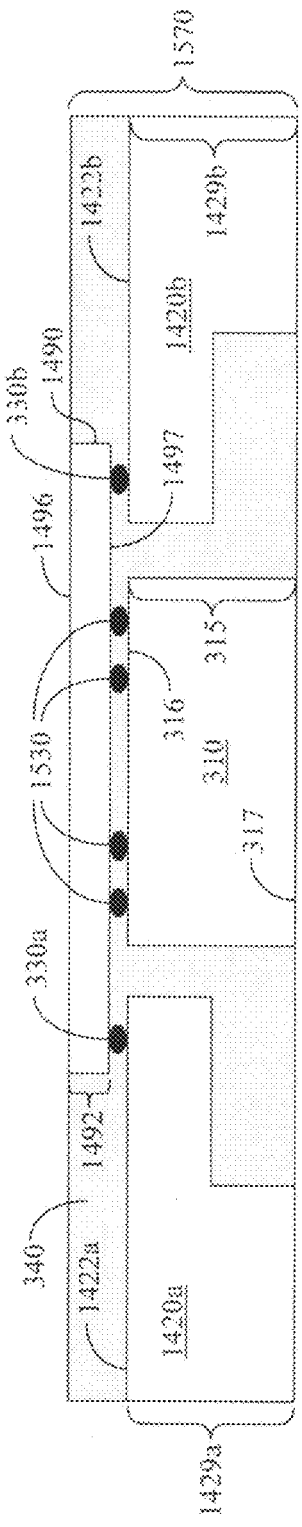
FIG. 16B shows an exemplary reduced-profile flip-flop semiconductor device package with an exposed device surface and an interposer in accordance with one embodiment of the present invention.

FIG. 16B shows exemplary reduced-profile flip-flop semiconductor device package 1600B with an exposed device surface and an interposer in accordance with one embodiment of the present invention. As shown in FIG. 16B, package 1600B is similar to package 1600A of FIG. 16A. However, package 1600B comprises less packaging material 340 above leadfingers 1420a and 1420b, thereby reducing the overall height or profile of package 1600B (e.g., with overall package height 1570) compared with that (e.g., 1550) of package 1600A. Additionally, in one embodiment, overall package height 1570 may be substantially equal to leadfinger heights 1429a and/or 1429b (e.g., where interposer thickness 1492 is small compared with leadfinger heights 1429a/1429b and/or overall package height 1570).

As shown in FIG. 16B, material 340 may be removed to expose portions (e.g., interposer surface 1496) of the interposer (e.g., 1490). Accordingly, the flip-flop configuration of package 1600B provides convenient means for providing test points, wire bondouts, or other features electrically coupled to the interposer and/or integrated circuit leadfingers/pins.

Although FIGS. 16A and 16B depict specific leadfinger heights (e.g., 1429a and 1429b), interposer thicknesses (e.g., 1492), device thicknesses (e.g., 315), and overall package heights (e.g., 1550 and 1570), it should be appreciated that one or more of these values may be varied in other embodiments. Additionally, although elements of packages 1600A and 1600B are depicted as simple shapes to simplify the drawing, it should be appreciated that one or more elements of FIG. 16A and/or FIG. 16B may assume alternative shapes in other embodiments.

Figure 17:
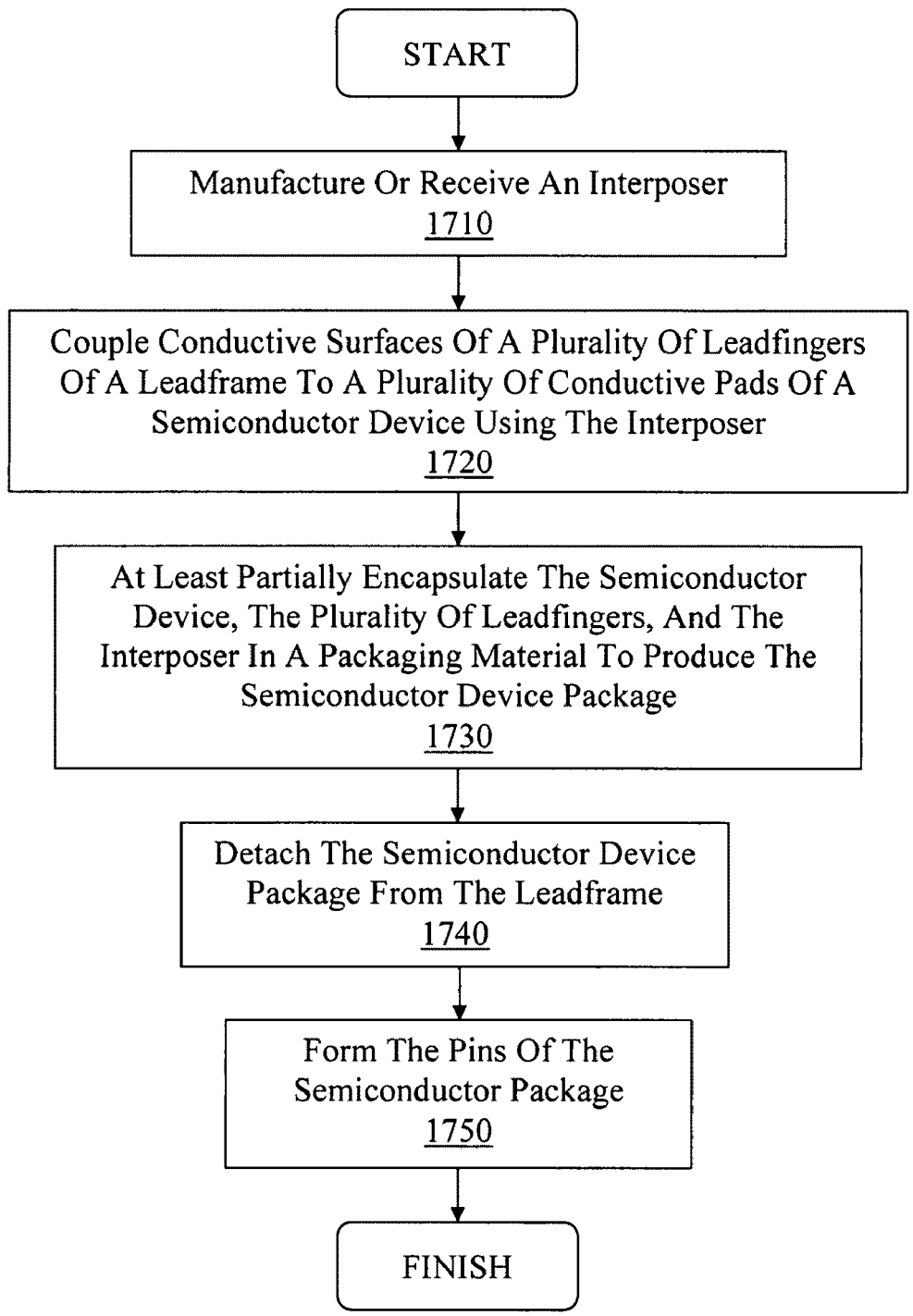
FIG. 17 shows an exemplary process for fabricating a semiconductor device package with an interposer in accordance with one embodiment of the present invention.

FIG. 17 shows exemplary process 1700 for fabricating a semiconductor device package with an interposer in accordance with one embodiment of the present invention. As shown in FIG. 17, step 1710 involves manufacturing or receiving an interposer (e.g., 1490). In one embodiment, the interposer (e.g., 1490) may comprise a single-layer PCB. In other embodiments, the interposer (e.g., 1490) may comprise a multi-layer PCB.

Step 1720 involves coupling conductive surfaced of a plurality of leadfingers of a leadframe to a plurality of conductive pads of a semiconductor device using the interposer. In one embodiment, interposer 1490 may be used to electrically and/or mechanically couple conductive surfaces (e.g., 1425) of a plurality of leadfingers (e.g., 1420, 1420a, 1420b, etc.) to a plurality of conductive pads (e.g., 1360) of a semiconductor device (e.g., 310). Additionally, the conductive pads (e.g., 1360) may be placed in peripheral regions (e.g., 1310-1340) and/or central regions (e.g., 1350) of a surface (e.g., 316) of the device (e.g., 310).

As shown in FIG. 17, step 1730 involves at least partially encapsulating the semiconductor device, the plurality of leadfingers, and the interposer in a packaging material to produce the semiconductor device package. In one embodiment, packaging material 340 may be used to at least partially encapsulate device 310, the plurality of leadfingers (e.g., 1420, 1420a, 1420b, etc.) coupled thereto, and the interposer (e.g., 1490) coupling the device and the leadfingers. As such, a flip-flop package (e.g., 1500A, 1500B, 1600A, 1600B, etc.) in accordance with FIGS. 15A-16B may be produced.

Step 1740 involves detaching the semiconductor package from the leadframe. The leadframe may be cut, sheared, etc. from the package (e.g., 1500A, 1500B, 1600A, 1600B, etc.), where the detached package may comprise an integrated circuit. Additionally, the portions of the leadfingers (e.g., 1420, 1420a, 1420b, etc.) extending from the package may comprise pins for attachment to printed circuit boards, for testing/verification, etc.

As shown in FIG. 17, step 1750 involves forming the pins of the semiconductor package. In one embodiment, the pins may be bent, cut, or otherwise modified to conform to one or more packaging standards (e.g., surface mount, through-hole, etc.). Alternatively, the pins may be modified to conform to a predetermined specification (e.g., a custom specification supplied by a customer, etc.).

Figure 18:
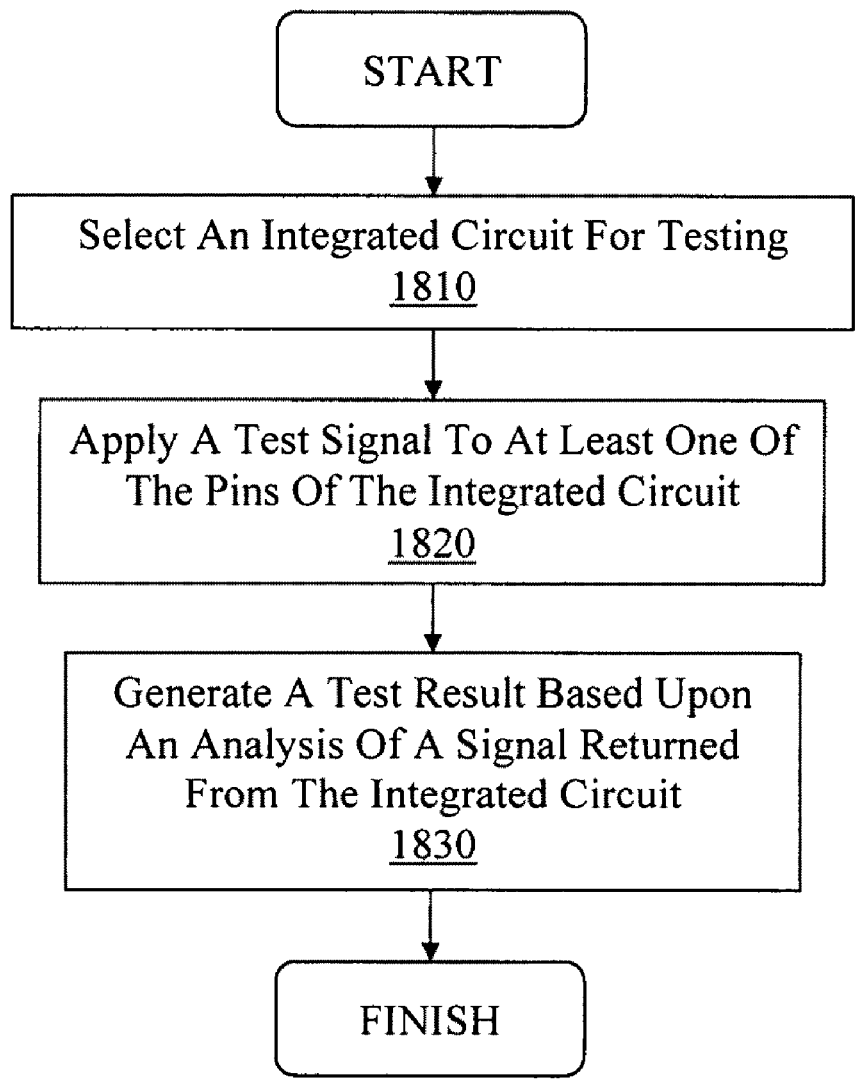
FIG. 18 shows an exemplary process for testing an integrated circuit with an interposer in accordance with one embodiment of the present invention.

FIG. 18 shows exemplary process 1800 for testing an integrated circuit with an interposer in accordance with one embodiment of the present invention. As shown in FIG. 18, step 1810 involves identifying an integrated circuit (e.g., a device under test) for testing. The identified integrated circuit may comprise a flip-flop package (e.g., 1500A, 1500B, 1600A, 1600B, etc.) utilizing an interposer (e.g., 1490) to electrically and/or mechanically couple conductive surfaces (e.g., 1425) of a plurality of leadfingers (e.g., 1420, 1420a, 1420b, etc.) to a plurality of conductive pads (e.g., 1360) of a semiconductor device (e.g., 310).

Step 1820 involves applying a test signal to at least one of the pins of the integrated circuit. The test signal may comprise one or more test patterns or vectors. Additionally, the testing may analyze functionality, performance (e.g., signal integrity, etc.), or other characteristics of the integrated circuit.

Analysis of a signal returned from the integrated circuit may be used to generate a test result in step 1830. In one embodiment, the test result may comprise a generated signal indicating results (e.g., pass/fail, qualitative and/or quantitative analysis, etc.) of the testing. Alternatively, the test result may comprise displayed analysis of the testing of the integrated circuit. And in another embodiment, the displayed analysis may comprise a print out or other hard copy of the results of the testing.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A method of fabricating a semiconductor device package, said method comprising:
    coupling conductive surfaces of a plurality of leadfingers of a leadframe to a plurality of conductive pads of a semiconductor device using an interposer, wherein said interposer comprises a printed circuit board with a plurality of traces for electrically coupling said conductive surfaces of said plurality of leadfingers to said plurality of conductive pads of said semiconductor device, and wherein said semiconductor device and said plurality of leadfingers are disposed in a flip-flop configuration;
    at least partially encapsulating said semiconductor device, said plurality of leadfingers, and said interposer in a packaging material to produce said semiconductor device package, wherein said plurality of leadfingers extend from said packaging material to form pins, and
    detaching said semiconductor device package from said leadframe.

2. The method of claim 1, further comprising:
    manufacturing said interposer.

3. The method of claim 1 further comprising:
    forming said pins of said semiconductor package.

4. The method of claim 1, wherein said conductive pads and said conductive surfaces couple to same surface of said interposer.

5. The method of claim 1, wherein said plurality of conductive pads comprise a first group of pads disposed in a peripheral region of said semiconductor device, and wherein said plurality of conductive pads comprise a second group of pads disposed in a central region of said semiconductor device.

6. The method of claim 1, wherein a height of said semiconductor device is less than a height of at least one of said plurality of leadfingers.

7. The method of claim 1, wherein a surface of said semiconductor device is exposed, and wherein said exposed surface opposes a surface comprising said plurality of conductive pads.

8. A method of testing an integrated circuit, said method comprising:
    selecting said integrated circuit for said testing, said integrated circuit comprising:
        a semiconductor device comprising a plurality of conductive pads;
        a plurality of leadfingers, wherein each leadfinger comprises a conductive surface for electrical coupling;
        an interposer for electrically coupling said conductive surfaces of said plurality of leadfingers to said plurality of conductive pads of said semiconductor device, wherein said interposer comprises a printed circuit board with a plurality of traces for electrically coupling said conductive surfaces of said plurality of leadfingers to said plurality of conductive pads of said semiconductor device, and wherein said semiconductor device and said plurality of leadfingers are disposed in a flip-flop configuration; and
        a packaging material at least partially encapsulating said semiconductor device, said plurality of leadfingers, and said interposer, wherein said plurality of leadfingers extend from said packaging material to form pins;
    applying a test signal to at least one of said pins of said integrated circuit; and
    generating a test result based upon an analysis of a signal returned from said integrated circuit.

9. The method of claim 8, wherein said plurality of conductive pads comprise a first group of pads disposed in a peripheral region of said semiconductor device, and wherein said plurality of conductive pads comprise a second group of pads disposed in a central region of said semiconductor device.

10. The method of claim 8, wherein a height of said semiconductor device is less than a height of at least one of said plurality of leadfingers.

11. The method of claim 8, wherein a surface of said semiconductor device is exposed, and wherein said exposed surface opposes a surface comprising said plurality of conductive pads.

* * * * *